(12) United States Patent
Ushio

(10) Patent No.: US 9,706,672 B2
(45) Date of Patent: Jul. 11, 2017

(54) VEHICLE-MOUNTED ELECTRONIC CONTROL DEVICE

(71) Applicant: Mitsubishi Electric Corporation, Tokyo (JP)

(72) Inventor: Kohei Ushio, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 15 days.

(21) Appl. No.: 14/651,248

(22) PCT Filed: Oct. 24, 2013

(86) PCT No.: PCT/JP2013/078819
§ 371 (c)(1),
(2) Date: Jun. 11, 2015

(87) PCT Pub. No.: WO2014/129012
PCT Pub. Date: Aug. 28, 2014

(65) Prior Publication Data
US 2015/0334854 A1    Nov. 19, 2015

(30) Foreign Application Priority Data

Feb. 20, 2013  (JP) ................................ 2013-030969

(51) Int. Cl.
*H05K 5/00*    (2006.01)
*H05K 7/14*    (2006.01)
(Continued)

(52) U.S. Cl.
CPC ......... *H05K 5/0026* (2013.01); *B62D 5/0406* (2013.01); *H01R 13/5227* (2013.01);
(Continued)

(58) Field of Classification Search
CPC .. H05K 5/0026; H05K 5/0069; H05K 5/0221; H05K 5/0217; H05K 7/1427; B62D 5/0406; H01R 13/5227; H01R 2201/26
(Continued)

(56) References Cited

U.S. PATENT DOCUMENTS 5,824,981 A * 10/1998 Suzuki ............... H01H 9/04
200/302.1
6,982,379 B2 * 1/2006 Saka ................. H05K 7/026
174/135
(Continued)

FOREIGN PATENT DOCUMENTS

JP     2008-290475 A    12/2008
JP     2009-023455 A     2/2009
(Continued)

OTHER PUBLICATIONS

International Search Report for PCT/JP2013/078819 dated Dec. 10, 2013.
(Continued)

*Primary Examiner* — Courtney Smith
*Assistant Examiner* — Sagar Shrestha
(74) *Attorney, Agent, or Firm* — Sughrue Mion, PLLC; Richard C. Turner

(57) ABSTRACT

Provided is a vehicle-mounted electronic control device including a control unit reduced in size, weight, and costs with improved contact reliability between electric components included in the control unit. In the vehicle-mounted electronic control device according to the present invention, a connector has a locking hole formed in a side surface relative to an upper surface that is an upward oriented surface, a fitting opening formed in a lower surface, and a
(Continued)

waterway for preventing flowing down water from entering the locking hole and the fitting opening, which is formed on a surface of the connector.

14 Claims, 24 Drawing Sheets

(51) Int. Cl.
    *H05K 5/02*                   (2006.01)
    *H01R 13/52*              (2006.01)
    *B62D 5/04*                   (2006.01)

(52) U.S. Cl.
    CPC ......... *H05K 5/0069* (2013.01); *H05K 5/0217* (2013.01); *H05K 5/0221* (2013.01); *H05K 7/1427* (2013.01); *H01R 2201/26* (2013.01)

(58) Field of Classification Search
    USPC ......... 361/679.01, 730, 752, 796; 174/17.08, 174/50, 50.02; 200/302.1
    See application file for complete search history.

(56) References Cited

U.S. PATENT DOCUMENTS

| | | | | |
|---|---|---|---|---|
| 8,632,139 B2* | 1/2014 | Oota | ................... | B62D 5/0406 312/100 |
| 2005/0227542 A1* | 10/2005 | Fukushima | ............ | H01R 9/245 439/620.27 |
| 2007/0054523 A1* | 3/2007 | Sasaki | ................... | H01R 9/223 439/157 |
| 2007/0076383 A1* | 4/2007 | Sasaki | ................... | H05K 5/063 361/752 |
| 2007/0086152 A1* | 4/2007 | Sasaki | ................. | B60R 16/0239 361/679.02 |
| 2008/0055821 A1* | 3/2008 | Sasaki | ................. | H01R 13/5227 361/601 |
| 2008/0268706 A1* | 10/2008 | Sheng | ................. | H01R 13/5213 439/587 |
| 2011/0005826 A1* | 1/2011 | Hashikura | .............. | H05K 7/026 174/547 |
| 2011/0090625 A1* | 4/2011 | Oota | ........................ | B62D 5/04 361/679.01 |
| 2012/0039054 A1* | 2/2012 | Oota | .................... | H05K 5/0052 361/759 |
| 2012/0258617 A1* | 10/2012 | Osawa | ............... | H01R 13/5227 439/205 |
| 2012/0307464 A1* | 12/2012 | Nakanishi | ........... | B60R 16/0238 361/752 |
| 2013/0066514 A1* | 3/2013 | Das | ........................ | G07C 5/008 701/31.5 |

FOREIGN PATENT DOCUMENTS

| | | |
|---|---|---|
| JP | 2009-046050 A | 3/2009 |
| JP | 2009-219322 A | 9/2009 |
| JP | 2011-103444 A | 5/2011 |
| JP | 2011-211852 A | 10/2011 |
| JP | 4993011 B2 | 8/2012 |
| JP | 2012-221612 A | 11/2012 |
| JP | 2013-015608 A | 1/2013 |

OTHER PUBLICATIONS

Written Opinion of PCT/JP2013/078819 dated Dec. 10, 2013.
Communication dated Aug. 9, 2016 from the State Intellectual Property Office of the P.R.C. in counterpart Application No. 201380073364.6.

* cited by examiner

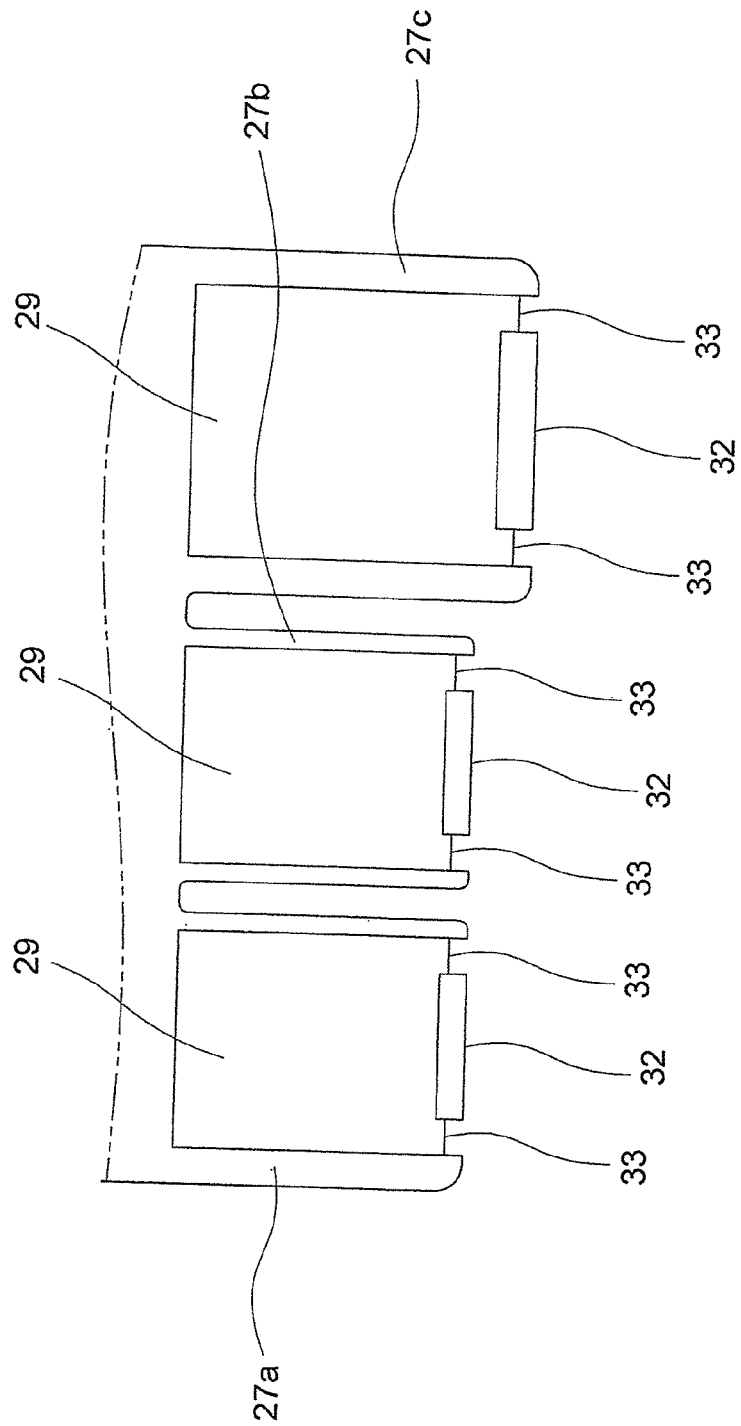

VEHICLE-MOUNTED ELECTRONIC CONTROL DEVICE

CROSS REFERENCE TO RELATED APPLICATIONS

This application is a National Stage of International Application No. PCT/JP2013/078819 filed Oct. 24, 2013, claiming priority based on Japanese Patent Application No. 2013-030969, filed Feb. 20, 2013, the contents of all of which are incorporated herein by reference in their entirety.

TECHNICAL FIELD

The present invention relates to a vehicle-mounted electronic control device including a control unit including a control board having a control circuit mounted thereon, a housing for covering the control board, and a connector exposed externally, for electrically connecting the control board and an external wiring to each other.

BACKGROUND ART

Hitherto, there is known an electric power steering device that is a vehicle-mounted electronic control device in which an upward oriented surface (upper surface) of an externally exposed connector of a control unit is arranged as an inclined surface with a downward inclination in a direction away from a unit cover that covers a power board, a frame, and a control board (see, for example, Patent Literature 1).

In the electric power steering device, even if a waterdrop falls on the upper surface, the waterdrop flows down in a direction away from the unit cover so that the waterdrop is prevented from entering inside of the unit cover.

CITATION LIST

Patent Literature

[PTL 1] JP 2009-23455 A

SUMMARY OF INVENTION

Technical Problems

In the electric power steering having the configuration described above, however, the waterdrop may flow down toward a fitting opening of the connector depending on vehicle conditions, such as running or stopped state of a vehicle in an inclined attitude, running on an uneven road surface, running through a curve, and deceleration, or usage conditions, such as a case where beverage is accidentally spilled down by a driver and a case where water splashed into the vehicle during vehicle washing.

In this case, the waterdrops are accumulated between a male connector and a female connector in the vicinity of the fitting opening of the connector. Further, the waterdrop flows down from an upward oriented surface of the male connector in the vicinity of the fitting opening along an edge portion of the fitting opening so that the waterdrop accumulates on a lower surface side of the connector fitting opening. As a result, there is a problem in that the waterdrop adheres to a connector contact portion or a wiring coupling portion through a slight gap between the male connector and the female connector due to a capillary action to corrode the contact portion or the coupling portion to lower contact reliability.

Further, there is a problem in that the above-mentioned contact reliability is similarly lowered by the waterdrop entering a locking hole of the connector, which is formed on a side surface of the connector.

Further, a direction of fitting the connector is formed oblique with respect to an outer surface of the control unit, while the locking hole is formed inside the connector so as to close the connector locking hole. As a result, a size of the control unit is increased. In addition, a die configuration becomes complex due to the need of an inner sliding mechanism for the die or the like. Thus, there is another problem in that weight and costs are increased.

Further, the unit cover covers an outer circumference of a side of the connector, which is connected to the control board. Therefore, the unit cover is increased in size. Thus, there is also a problem in that the weight and costs of the control unit are further increased.

The present invention has been made to solve the problems described above, and therefore has an object to provide a vehicle-mounted electronic control device including a control unit reduced in size, weight, and costs with improved contact reliability between electric components included in the control unit.

Solution to Problems

According to one embodiment of the present invention, there is provided a vehicle-mounted electronic control device, including a control unit including:
   a control board having a control circuit mounted thereon;
   a housing for covering the control board; and
   a connector exposed externally, for electrically connecting the control board and an external wiring to each other,
   the connector having an opening hole formed in at least one of a side surface and a lower surface relative to an upper surface that is an upward oriented surface, and a waterway formed on a surface of the connector, for preventing flowing down water from entering the opening hole.

Advantageous Effects of Invention

In the vehicle-mounted electronic control device according to the one embodiment of the present invention, the connector has the opening hole formed in at least one of the side surface and the lower surface relative to the upper surface that is the upward oriented surface, and the waterway for preventing the flowing down water from entering the opening hole, which is formed on the surface. Thus, with the simple configuration, the control unit can be reduced in size, weight, and costs, whereas the contact reliability between electric components included in the control unit can be improved.

BRIEF DESCRIPTION OF DRAWINGS

FIG. 33 is an enlarged plan view illustrating a principal part of a modification of an electric power steering device according to a first embodiment of the present invention to a fourteenth embodiment of the present invention.

DESCRIPTION OF EMBODIMENTS

Figure 1:
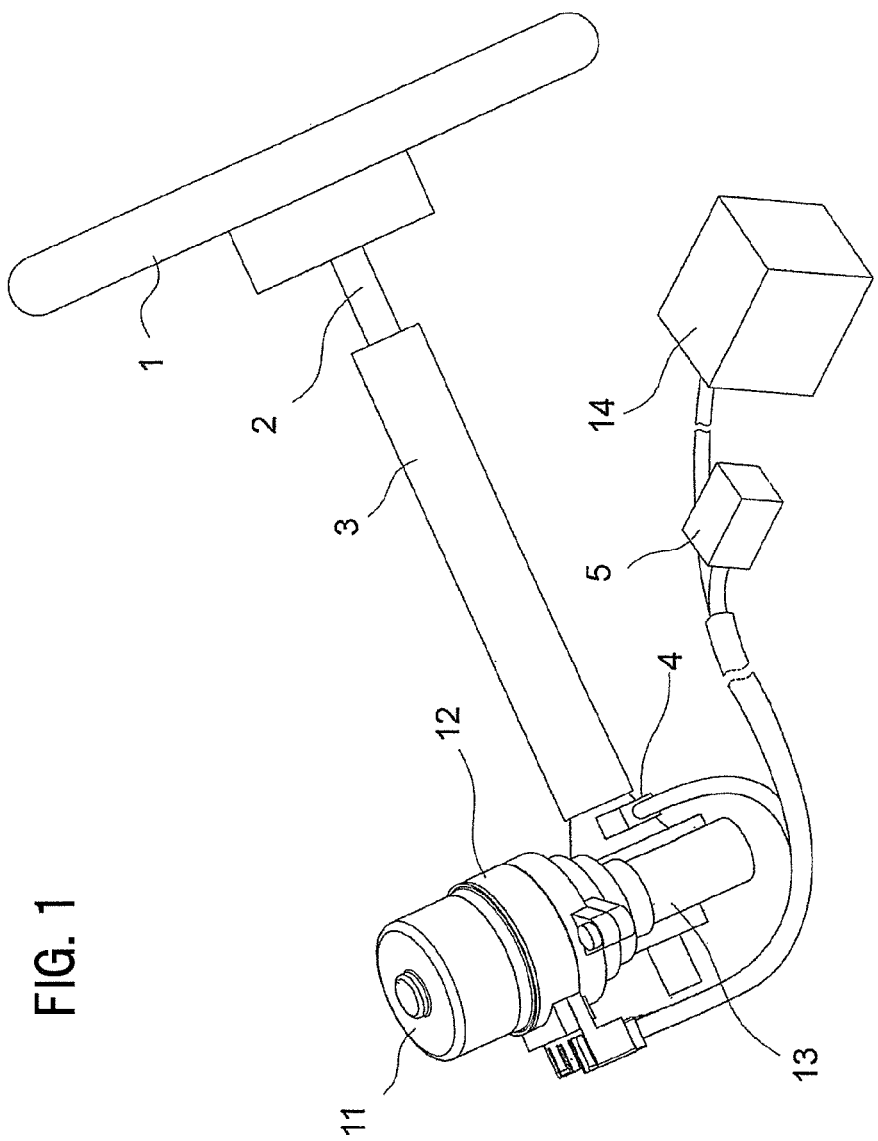
FIG. 1 is a perspective view illustrating an electric power steering device according to a first embodiment of the present invention.

Referring to the accompanying drawings, embodiments of the present invention are described below. In the drawings, the same or corresponding members and parts are denoted by the same reference symbols for description.

First Embodiment

FIG. 1 is a perspective view illustrating an electric power steering device according to a first embodiment of the present invention.

The electric power steering device that is a vehicle-mounted electronic control device includes a steering column 3 including a steering shaft 2 coupled to a steering wheel 1 inserted therein, a torque sensor 4 for detecting a steering torque of the steering wheel 1, a vehicle-speed sensor 5 for detecting a running speed of a vehicle, an electric motor 11 for outputting an assist torque to the steering wheel 1, a control unit 12 to which signals from the torque sensor 14 and the vehicle-speed sensor 5 are input, for controlling driving of the electric motor 11 so as to correspond to the steering torque or vehicle running conditions, a speed-reduction gearbox 13 coupled to the steering column 3, for reducing a rotation speed of the electric motor 11, and a power supply unit 14 for supplying a current for driving the electric motor 11.

Figure 2:
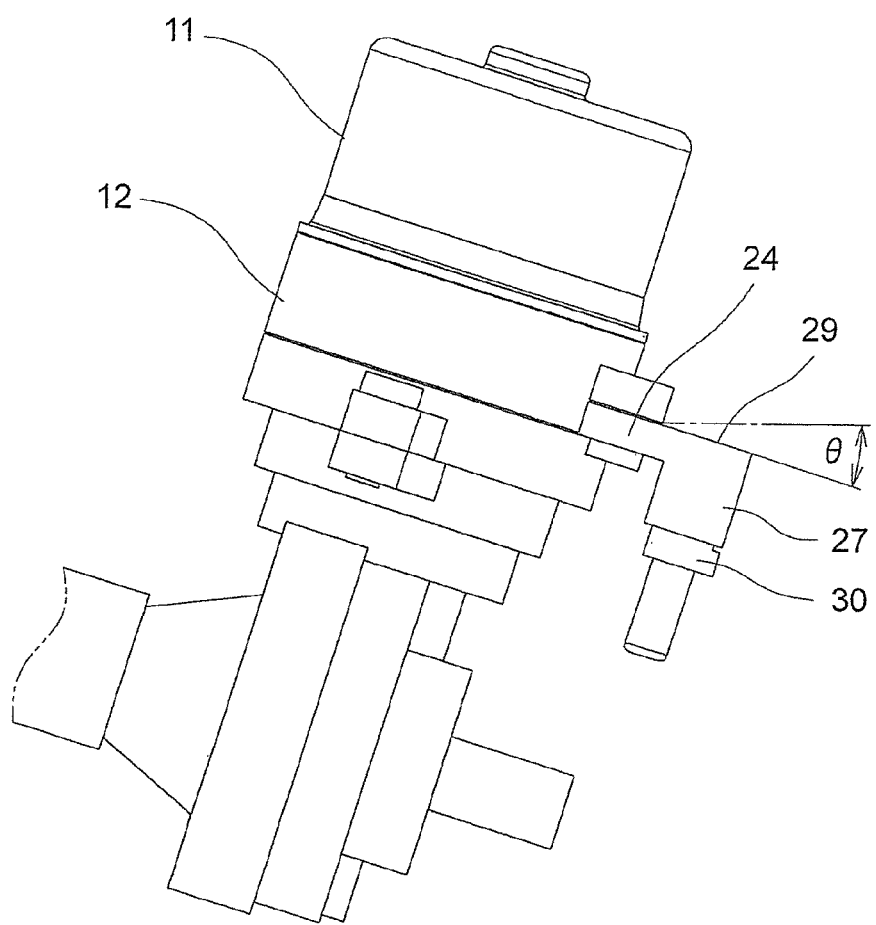
FIG. 2 is a side view of a principal part of FIG. 1.
Figure 3:
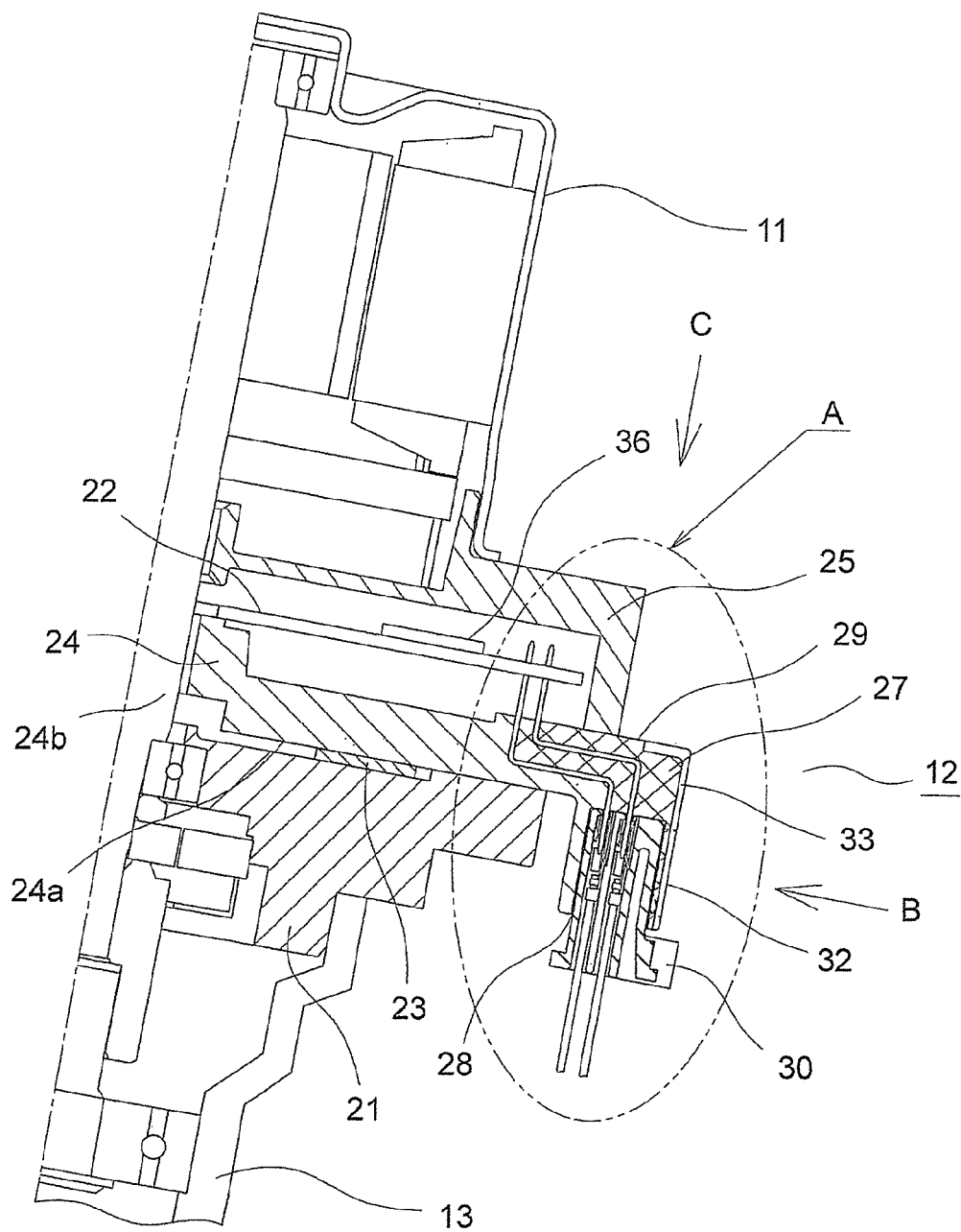
FIG. 3 is a half sectional view illustrating the electric motor and the control unit illustrated in FIG. 2.
Figure 4:
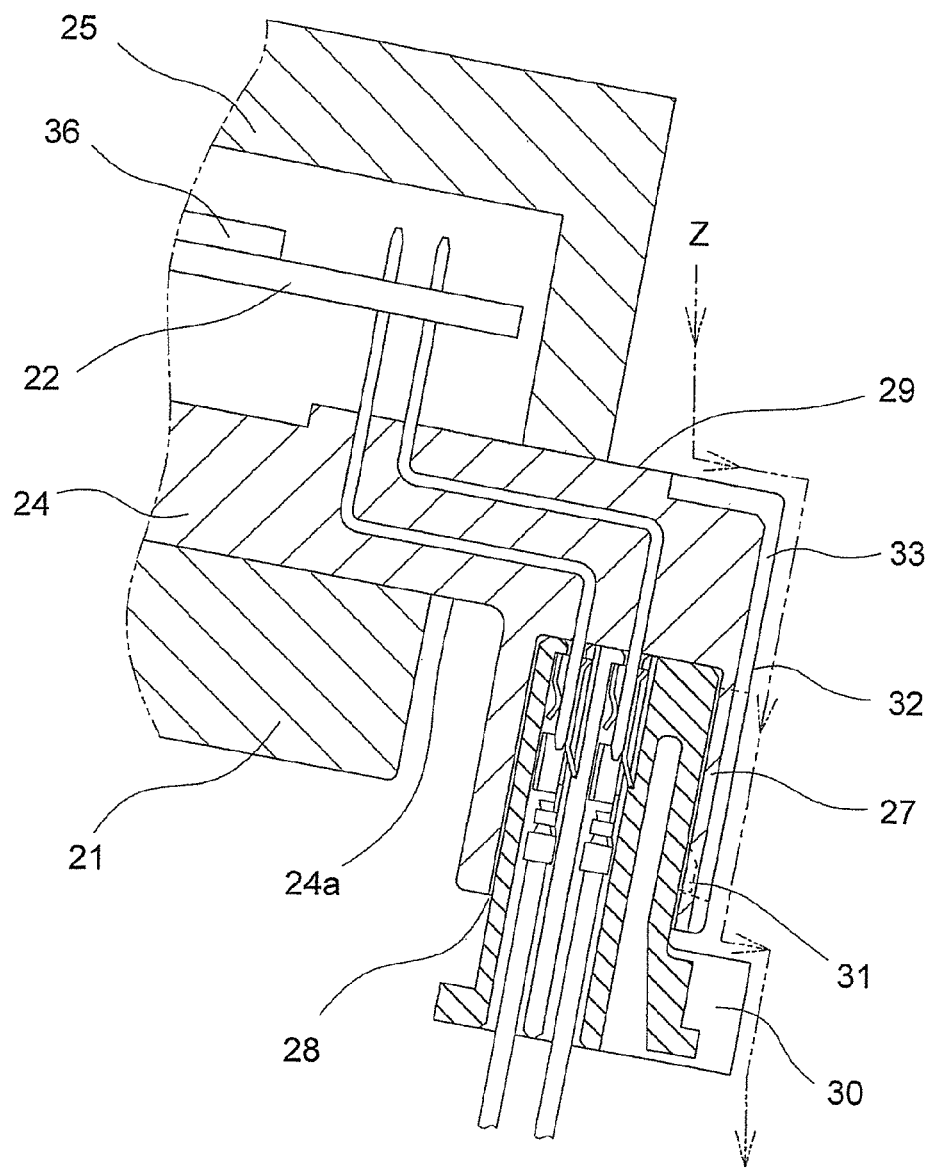
FIG. 4 is an enlarged view illustrating a portion (portion A) indicated by the arrow A in FIG. 3.
Figure 5:
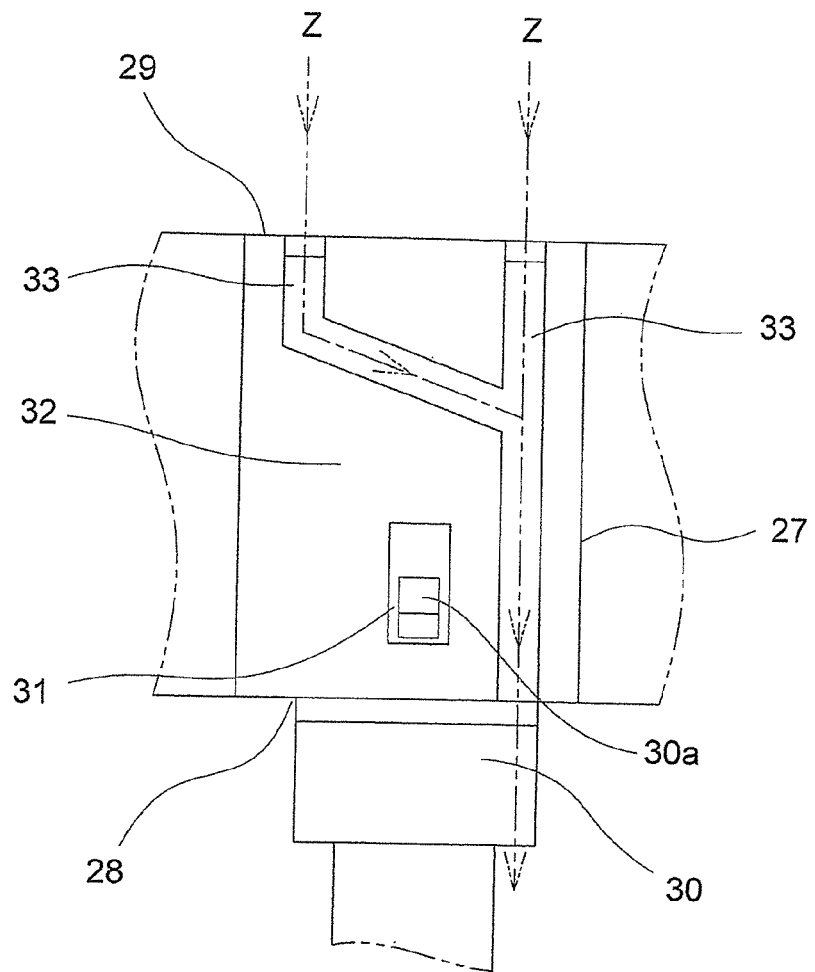
FIG. 5 is a partial view of the portion A in FIG. 3 as viewed from a direction indicated by the arrow B.
Figure 6:
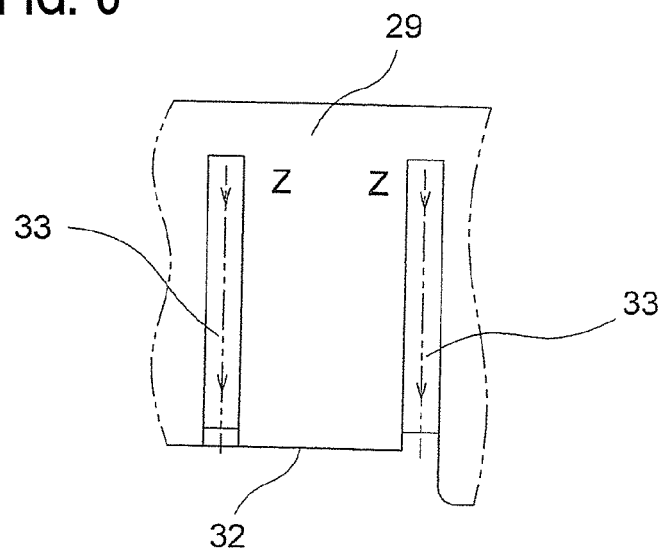
FIG. 6 is a partial view of the portion A in FIG. 3 as viewed from a direction indicated by the arrow C.

FIG. 2 is a side view of a principal part of FIG. 1, FIG. 3 is a half sectional view illustrating the electric motor 11 and the control unit 12 illustrated in FIG. 2, FIG. 4 is an enlarged view illustrating a portion (portion A) indicated by the arrow A in FIG. 3, FIG. 5 is a partial view of the portion A in FIG. 3 as viewed from a direction indicated by the arrow B, and FIG. 6 is a partial view of the portion A in FIG. 3 as viewed from a direction indicated by the arrow C.

The control unit 12 includes a heat sink 21 made of a metal having a high thermal conductivity, a frame 24 arranged on the heat sink 21, on which a plurality of leading wires and conductive plates are formed by insert molding, a control board 22 arranged on the frame 24 and electrically connected to the leading wires of the frame, on which a control circuit for controlling driving of the electric motor 11 is mounted, a power unit 23 arranged between the heat sink 21 and the frame 24, for driving the electric motor 11, a housing 25 that surrounds the control board 22, and a female connector 27 formed integrally with the frame 24 so as to be exposed externally.

The female connector 27 includes, as an integral block body, a torque-sensor connector unit that is electrically connected to the torque sensor 4 through an external wiring, a vehicle-speed connector unit that is electrically connected to the vehicle-speed sensor 5 through an external wiring, and a power-supply unit connector unit that is electrically connected to the connector unit 14 through an external wiring.

The female connector 27 has a fitting opening 28 that is an opening hole formed so as to be oriented vertically downward relative to a reference plane 24a of the frame 24. Further, the female connector 27 is inclined downward at an angle 8 with respect to a horizontal direction along an upper surface 29 that is an upward oriented surface of the female connector when the female connector 27 is viewed from a front side, as illustrated in FIG. 2.

Locking holes 31 that are opening holes for the torque sensor 4, the vehicle-speed sensor 5, and the power supply unit 14, are formed in a side surface 32 of the female connector 27.

By elastically locking projections 30a to the locking holes 31, a male connector 30 is held to the female connector 27. Further, the torque sensor 4, the vehicle-speed sensor 5, and the power supply unit 14 are elastically connected to the control unit 12.

A plurality of waterways 33 extending in parallel are formed on the upper surface 29 of the female connector 27. The waterways 33 join together on the side surface 32 of the female connector 27 at the middle and then directly extend on one side of the locking holes 31.

In the electric power steering device having the configuration described above, an ignition switch (not shown) of a vehicle is brought into an ON state so as to supply power from the power supply unit 14 to the control unit 12 through the female connector 27.

Further, in the control unit 12, information signals from the torque sensor 4 and the vehicle-speed sensor 5 are input to a microcomputer 36 mounted on the control board 22 through the female connector 27. The microcomputer 36 computes a current value corresponding to the steering assist torque. A motor driving current flows through the electric motor 11 by the power unit 23. A required amount of assist torque is output in a required rotating direction from the electric motor 11.

In this embodiment, the female connector 27, which is formed integrally with the frame 24, has the fitting opening 28 oriented vertically downward relative to the basic plane 24a of the frame 24. Further, the upper surface 29 of the female connector 27 is inclined downward to a near side at the angle θ relative to the horizontal direction when the female connector 27 is viewed from the front side. Further, the waterways 33 formed on the upper surface 29 are formed so as to be located away from the locking holes 31 on the side surface 32.

Therefore, even when a waterdrop falls from above of the female connector 27, the waterdrop flows in a direction indicated by the arrows Z along the waterways 33 so as to be discharged regardless of vehicle conditions and usage conditions. Therefore, the waterdrop is prevented from entering inside of the control unit 12 through the fitting opening 28 and also is prevented from entering inside of the control unit 12 through the locking holes 31.

It is conceivable to close the locking holes so as to prevent the waterdrop from entering through the locking holes. In this case, however, a shape of the female connector is increased. Further, a die sliding structure for providing a locking mechanism for locking the projections 30a of the female connector 30 to the locking holes must be added.

On the other hand, the locking holes 31 of this embodiment are held in communication with exterior. Thus, the female connector 27 can be reduced in size, while the die structure can be simplified. Therefore, the control unit 12 can be reduced in weight and costs.

Further, although the housing 25 covers the control board 22, an outer circumference of the female connector 27 on the side connected to the control board 22 is not required to be surrounded by the housing 25. Therefore, the housing 25 can be reduced in size, which enables the control unit 12 to be reduced in weight and costs.

Second Embodiment

Figure 7:
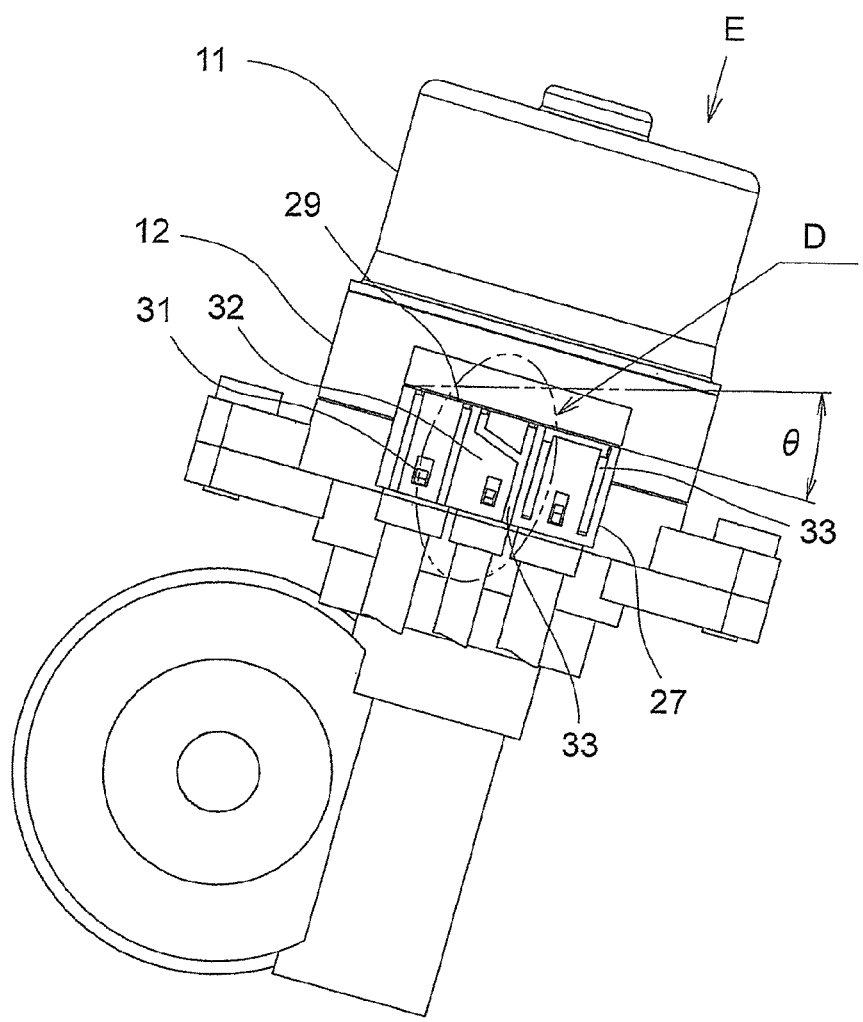
FIG. 7 is a front view of a principal part, for illustrating an electric power steering device according to a second embodiment of the present invention.
Figure 8:
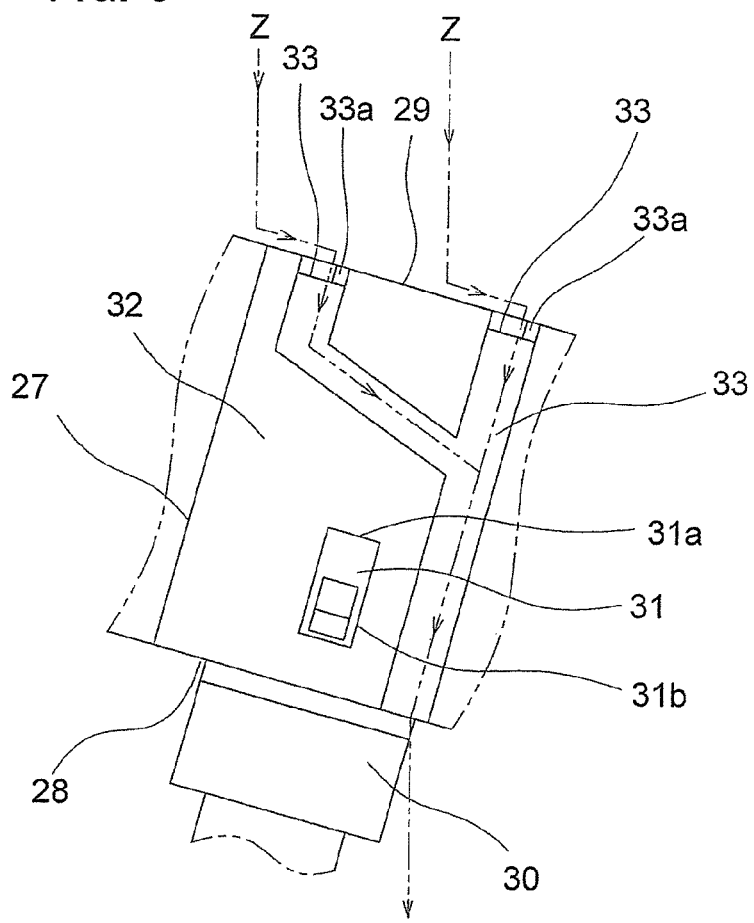
FIG. 8 is an enlarged view illustrating a portion (portion D) indicated by the arrow D in FIG. 7.
Figure 9:
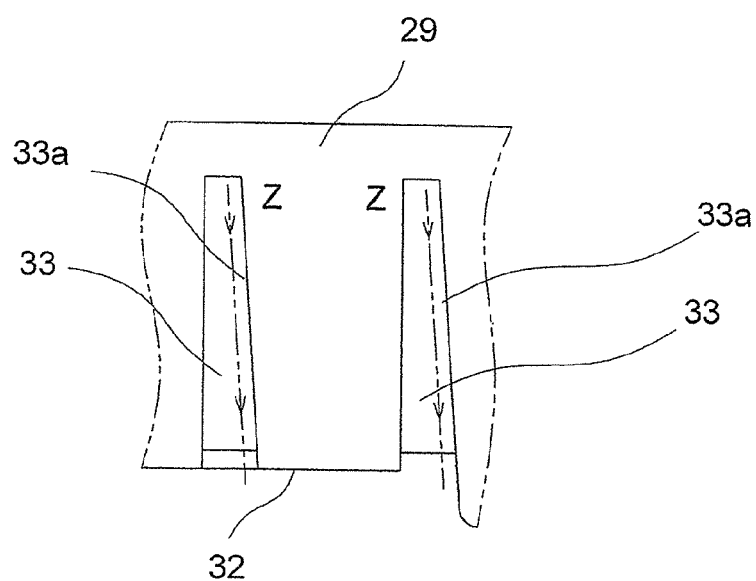
FIG. 9 is a view of the portion D in FIG. 7, as viewed from a direction of the arrow E.

FIG. 7 is a front view of a principal part, for illustrating an electric power steering device according to a second embodiment of the present invention, FIG. 8 is an enlarged view illustrating a portion (portion D) indicated by the arrow D in FIG. 7, and FIG. 9 is a view of the portion D in FIG. 7, as viewed from a direction of the arrow E.

In this embodiment, as illustrated in FIG. 7, the upper surface 29 is inclined at the angle θ toward one side in a width direction when the female connector 27 is viewed from the front side along the upper surface 29. Further, waterway walls 33a of the waterways 33 formed on the downstream side on the upper surface 29 of the female connector 27 are inclined so that a width increases toward the downstream.

The remaining configuration is the same as that of the electric power steering device of the first embodiment.

According to the electric power steering device of this embodiment, the same effects as those of the first embodiment can be obtained. In addition, the waterways 33 formed on the upper surface 29 have the width increasing toward the downstream. Therefore, even an increase in the amount of water in the waterways 33 on the upper surface 29 can be more reliably guided to the waterways 33 on the side surface 32.

Third Embodiment

Figure 10:
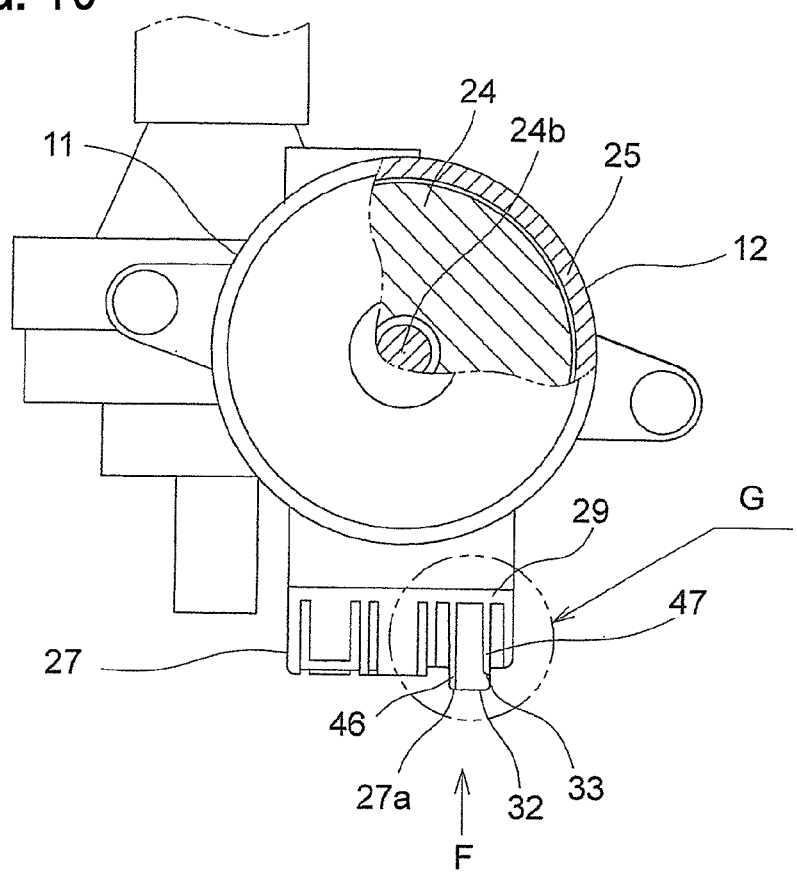
FIG. 10 is a plan view illustrating an electric power steering device according to a third embodiment of the present invention.
Figure 11:
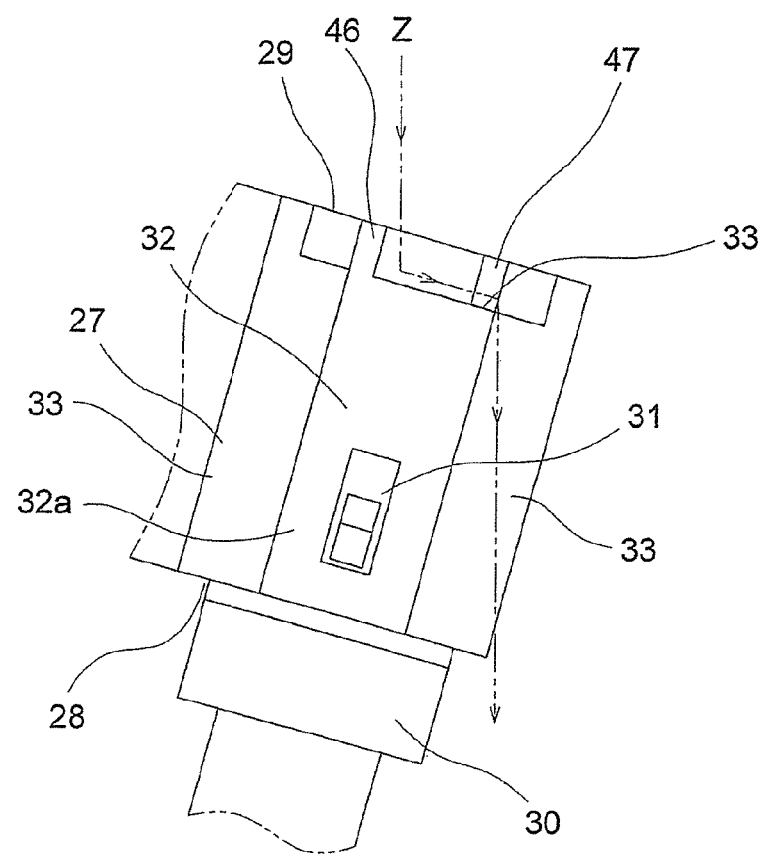
FIG. 11 is a view of a portion (portion G) indicated by the arrow G in FIG. 10 as viewed from a direction indicated by the arrow F.
Figure 12:
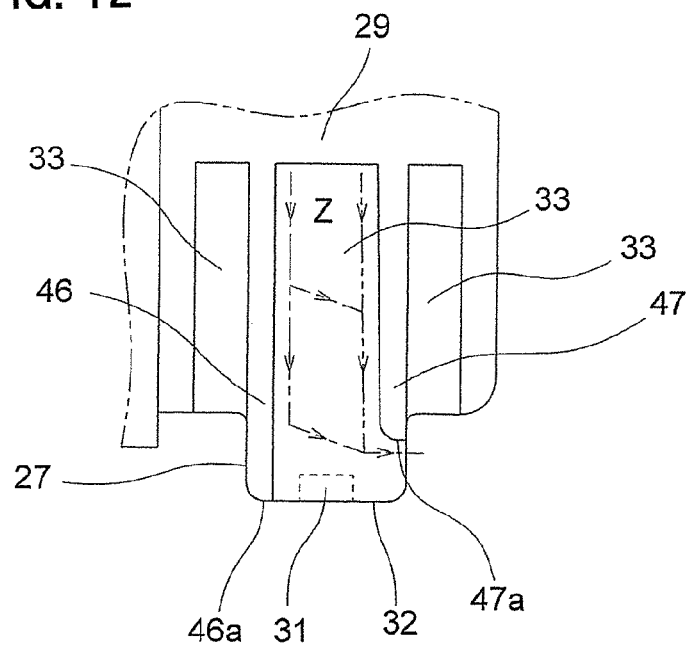
FIG. 12 is an enlarged view of the portion G in FIG. 10.

FIG. 10 is a plan view illustrating an electric power steering device according to a third embodiment of the present invention, FIG. 11 is a view of a portion (portion G) indicated by the arrow G in FIG. 10 as viewed from a direction indicated by the arrow F, and FIG. 12 is an enlarged view of the portion G in FIG. 10.

In this embodiment, a convex surface 32a having a large width extending in the vertical direction is formed on the side surface 32 of the female connector 27. A first rib 46 connected to the convex surface 32a is formed on an upper portion of the inclined surface of the upper surface 29. Further, the first rib 46 and a second rib 47 are formed on a lower portion of the inclined surface of the upper surface 29 so as to be opposed to each other through the locking holes 31 therebetween.

Regarding the first rib 46 and the second rib 47, a length of the second rib 47 is shorter than that of the first rib 46. An end surface 47a is located radially inside of an end surface 46a of the first rib 46.

The remaining configuration is the same as that of the electric power steering device of the second embodiment.

The first rib 46 and the second rib 47 may also be formed so as to be opposed to each other even through the fitting opening 28 therebetween.

According to the electric power steering device of this embodiment, water interposed between the first rib 46 and the second rib 47 on the upper surface 29 flows as indicated by the arrow Z and flows down away from the fitting opening 28 that is a downward oriented opening hole and the locking holes 31 on the side surface 32 of the female connector 27. Therefore, the same effects as those of the electric power steering device of the first embodiment can be obtained.

Even water flowing through the waterways 33 on both sides of the convex surface 32a similarly flows down away from the fitting opening 28 and the locking holes 31.

Fourth Embodiment

Figure 13:
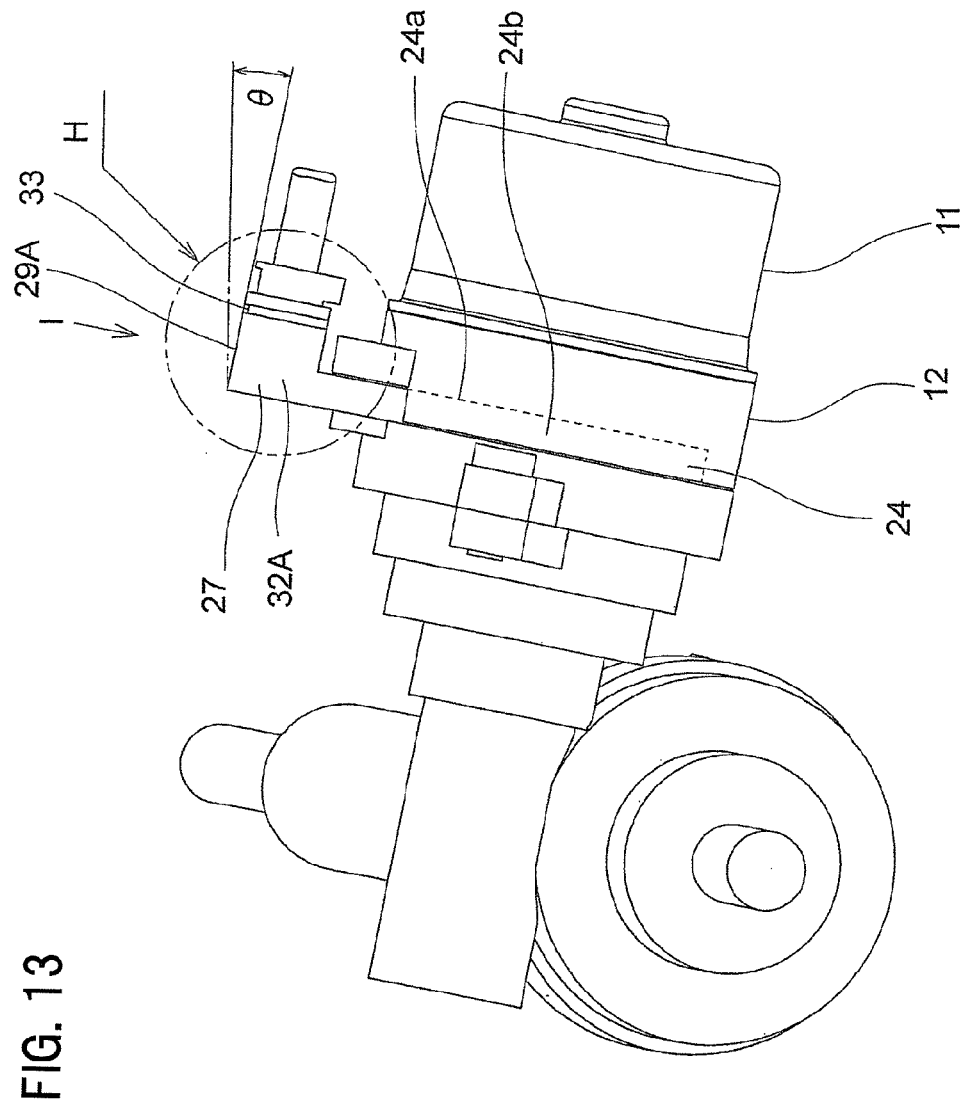
FIG. 13 is a side view of an electric power steering device according to a fourth embodiment of the present invention.
Figure 14:
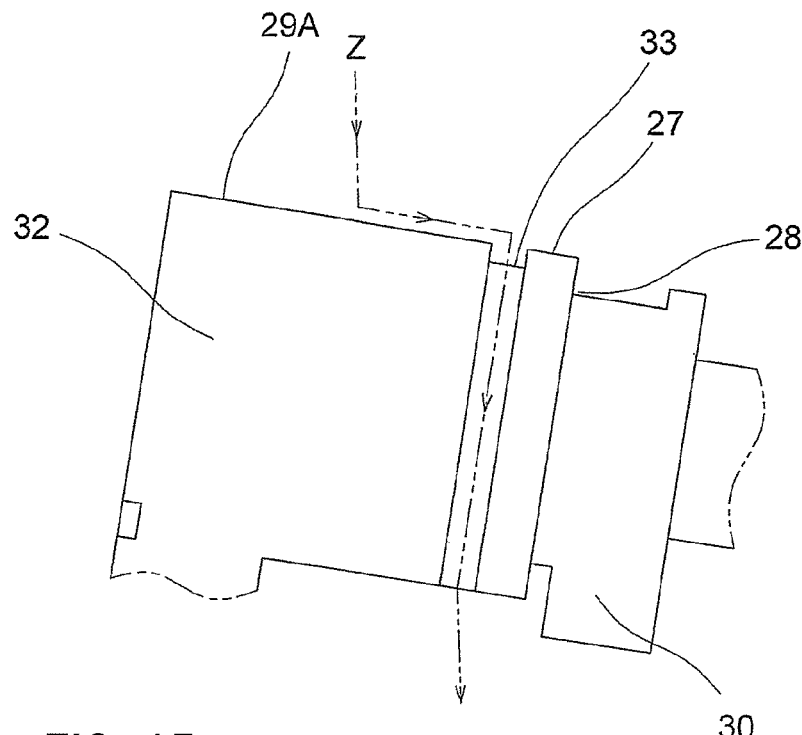
FIG. 14 is an enlarged view illustrating a portion (portion H) indicated by the arrow H in FIG. 13.
Figure 15:
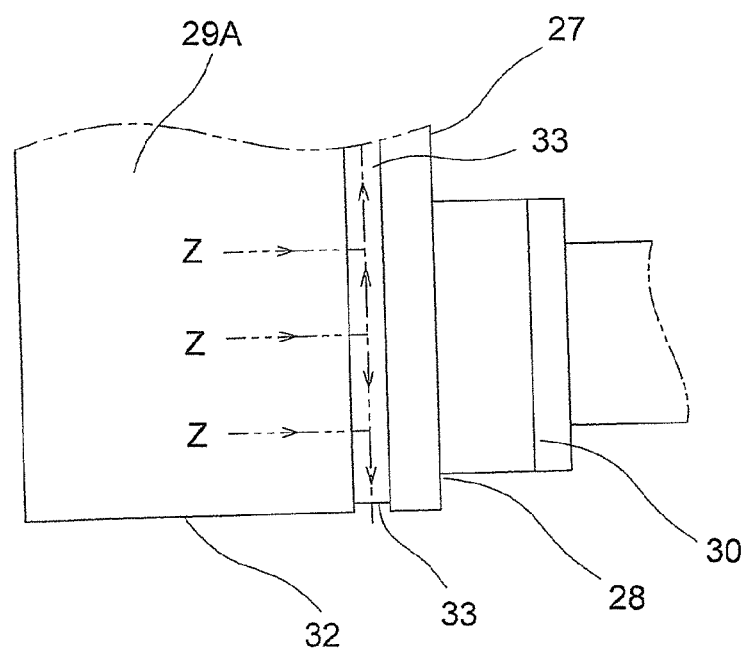
FIG. 15 is a view as viewed from a direction of the arrow I in FIG. 13.

FIG. 13 is a side view of an electric power steering device according to a fourth embodiment of the present invention, FIG. 14 is an enlarged view illustrating a portion (portion H) indicated by the arrow H in FIG. 13, and FIG. 15 is a view as viewed from a direction of the arrow I in FIG. 13.

In the electric power steering device according to the first to third embodiment, the fitting opening 28 of the female connector 27 is vertically downward oriented relative to the reference plane 24a of the frame 24. In the electric power steering device according to this embodiment, the fitting opening 28 of the female connector 27 is oriented downward at the angle θ relative to a horizontal plane.

On an upper surface 29A of the female connector 27, which is an upward oriented surface on the side closer to the fitting opening 28 side, the waterway 33 extending linearly in a circumferential direction is formed.

The locking holes 31 are formed on a lower surface of the female connector 27.

According to the electric power steering device of this embodiment, water on the upper surface 29A of the female connector 27 flows down along the waterway 33 as indicated by the arrow Z. Therefore, the same effects as those of the electric power steering device of the first embodiment can be obtained.

Fifth Embodiment

Figure 16:
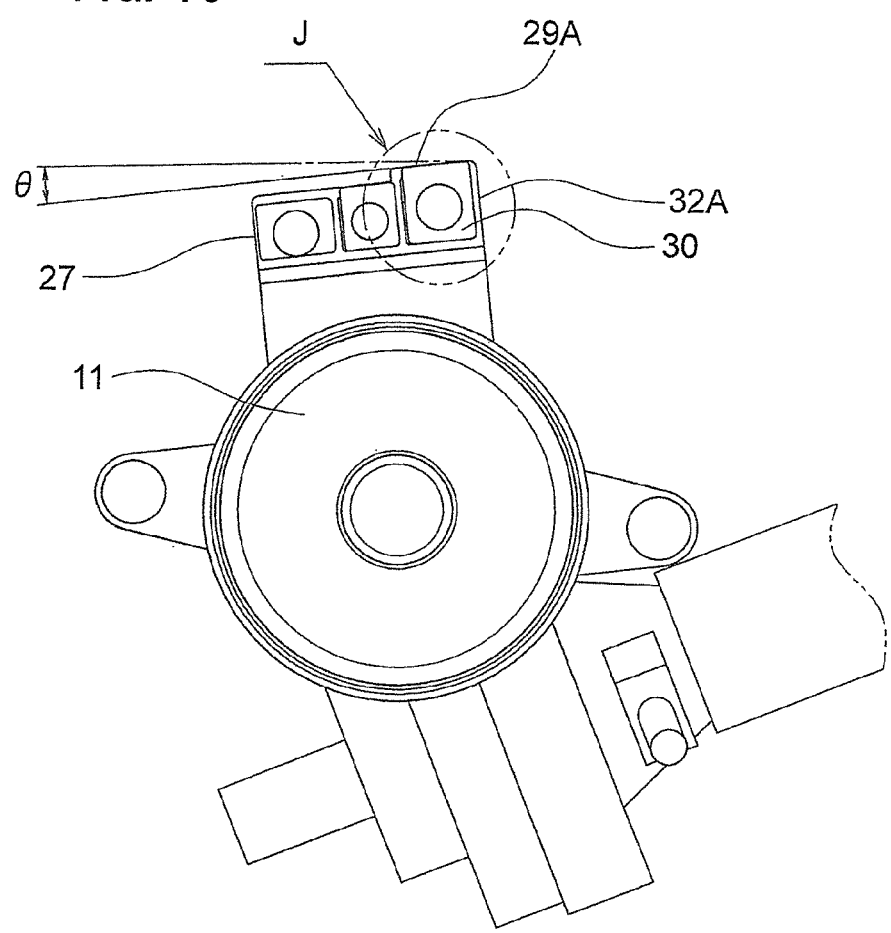
FIG. 16 is a side view illustrating an electric power steering device according to a fifth embodiment of the present invention.
Figure 17:
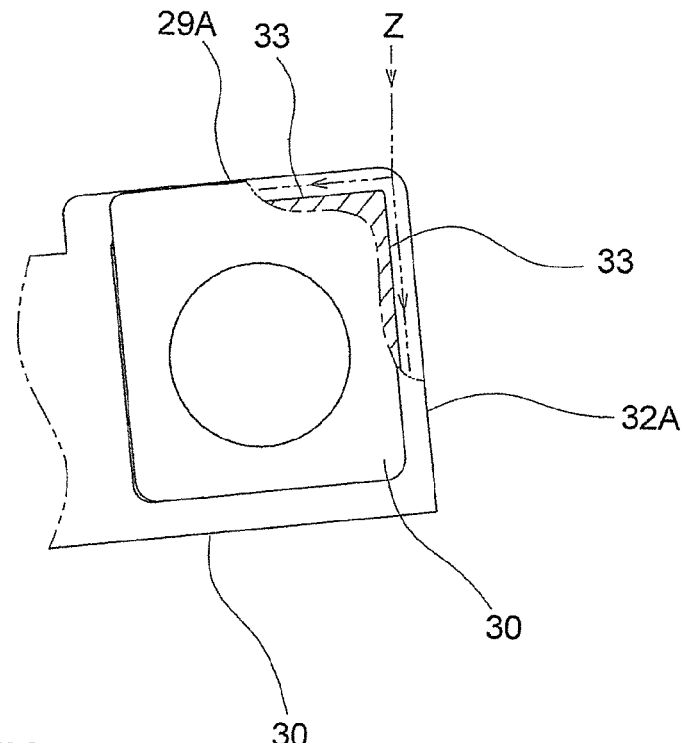
FIG. 17 is an enlarged view illustrating a portion (portion J) indicated by the arrow J in FIG. 16.

FIG. 16 is a side view illustrating an electric power steering device according to a fifth embodiment of the present invention, and FIG. 17 is an enlarged view illustrating a portion (portion J) indicated by the arrow J in FIG. 16.

In this embodiment, the upper surface 29A of the female connector 27 is inclined at the angle θ relative to the horizontal direction toward one side in the width direction when the female connector 27 is viewed from the front side along the upper surface 29A. On the upper surface 29A and a side surface 32A of the female connector 27, a plurality of the waterways 33, each having an L-like shape, along the upper surface 29A and the side surface 32A are formed.

The remaining configuration is the same as that of the electric power steering device of the fourth embodiment.

According to the electric power steering device of this embodiment, water falls along the waterways 33 formed on the upper surface 29A and the side surface 32A of the female connector 27 as indicated by the arrow Z. Therefore, the same effects as those of the electric power steering device according to the first embodiment can be obtained.

Sixth Embodiment

Figure 18:
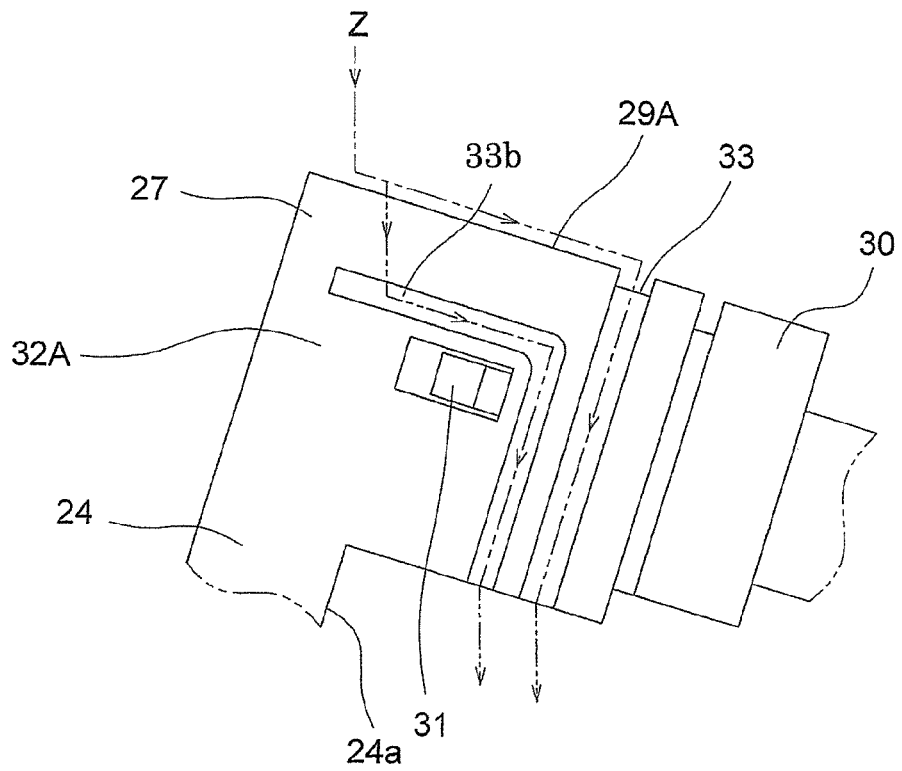
FIG. 18 is a side view illustrating a principal part of an electric power steering device according to a sixth embodiment of the present invention.

FIG. 18 is a side view illustrating a principal part of an electric power steering device according to a sixth embodiment of the present invention.

In this embodiment, the locking holes 31 are formed in the side surface 32A of the female connector 27. On the side surface 32A, a locking-hole waterway 33b having one side located above the locking hole 31 so as to extend in parallel to the upper surface 29A and another side extending in parallel to the waterway 33 is formed.

The remaining configuration is the same as that of the electric power steering device of the fourth embodiment.

According to the electric power steering device of this embodiment, water falls along the waterways 33 and the locking-hole waterway 33b as indicated by the arrow Z. Therefore, the same effects as those of the electric power steering device according to the first embodiment can be obtained.

Seventh Embodiment

Figure 19:
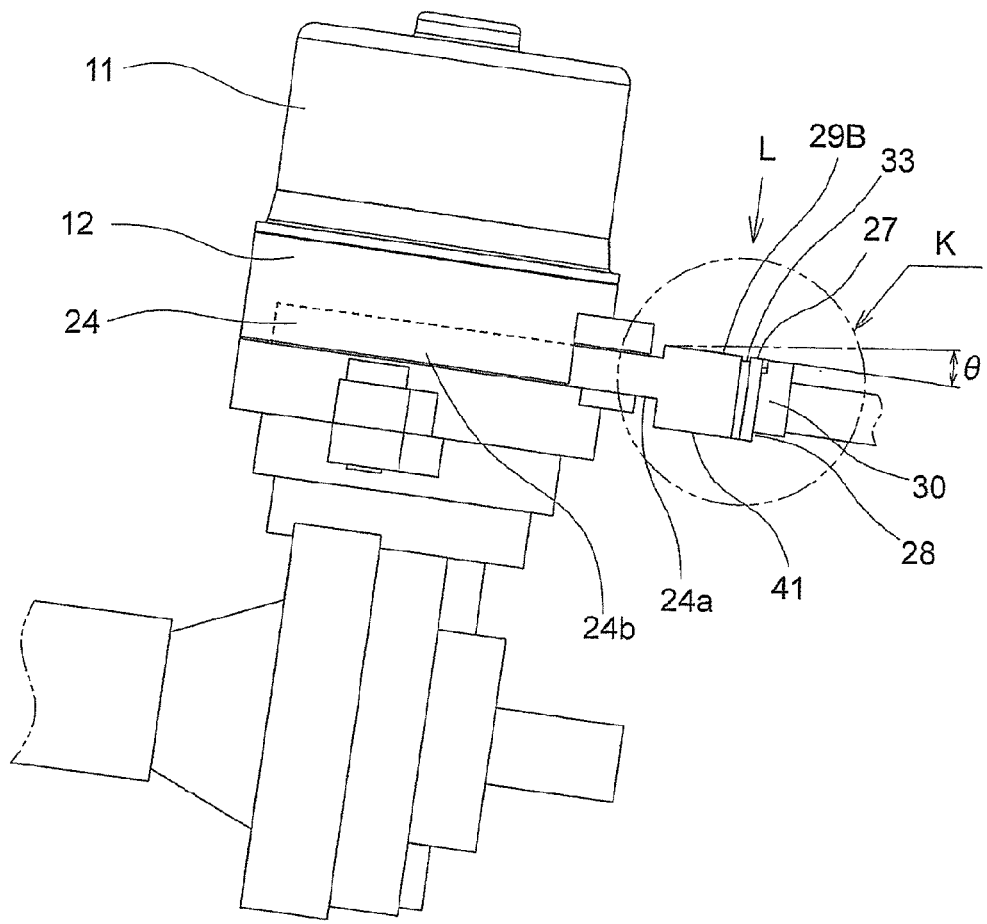
FIG. 19 is a side view of an electric power steering device according to a seventh embodiment of the present invention.
Figure 20:
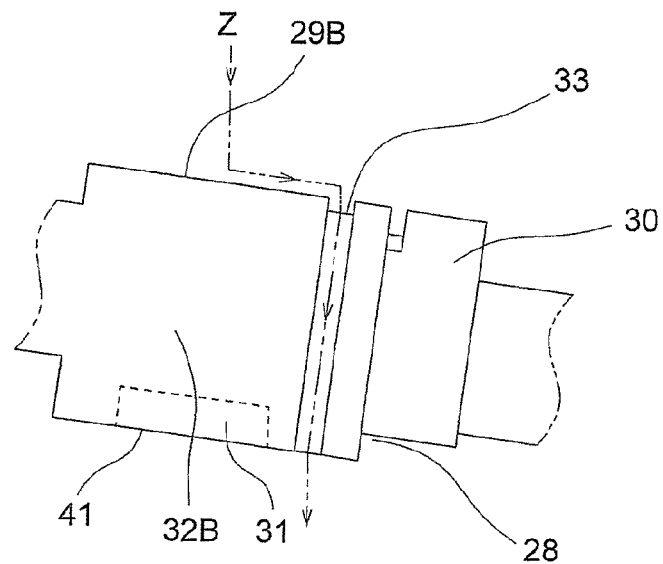
FIG. 20 is an enlarged view illustrating a portion (portion K) indicated by the arrow K in FIG. 19.
Figure 21:
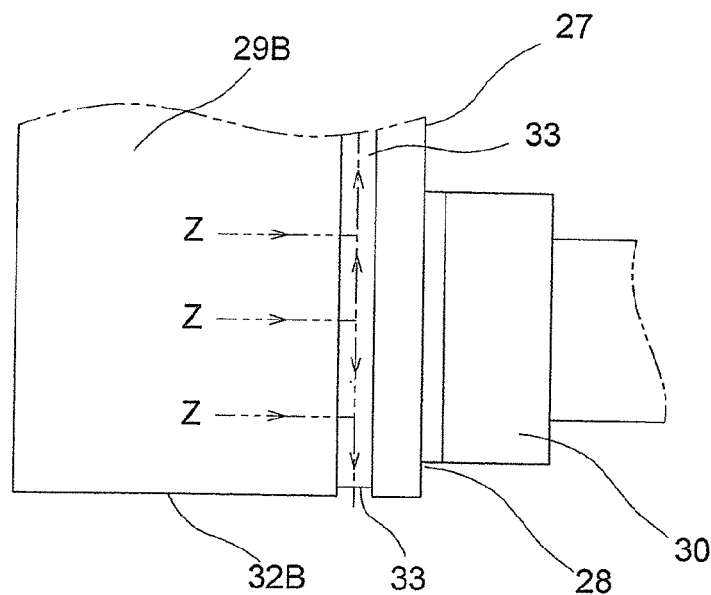
FIG. 21 is a view of the portion K in FIG. 19, as viewed from a direction of the arrow L.

FIG. 19 is a side view of an electric power steering device according to a seventh embodiment of the present invention, FIG. 20 is an enlarged view illustrating a portion (portion K) indicated by the arrow K in FIG. 19, and FIG. 21 is a view of the portion K in FIG. 19, as viewed from a direction of the arrow L.

In this embodiment, the fitting opening 28 of the female connector 27 is oriented in the same direction as the basic plane of the frame 24 and downward at the angle θ relative to the horizontal direction. The waterway 33 is formed on an upper surface 29B that is an upward oriented surface and both side surfaces 32B of the female connector 27.

The remaining configuration is the same as that of the electric power steering device of the first embodiment.

According to the electric power steering device of this embodiment, water falls along the waterways 33 as indicated by the arrow Z. Therefore, the same effects as those of the electric power steering device according to the first embodiment can be obtained.

Eighth Embodiment

Figure 22:
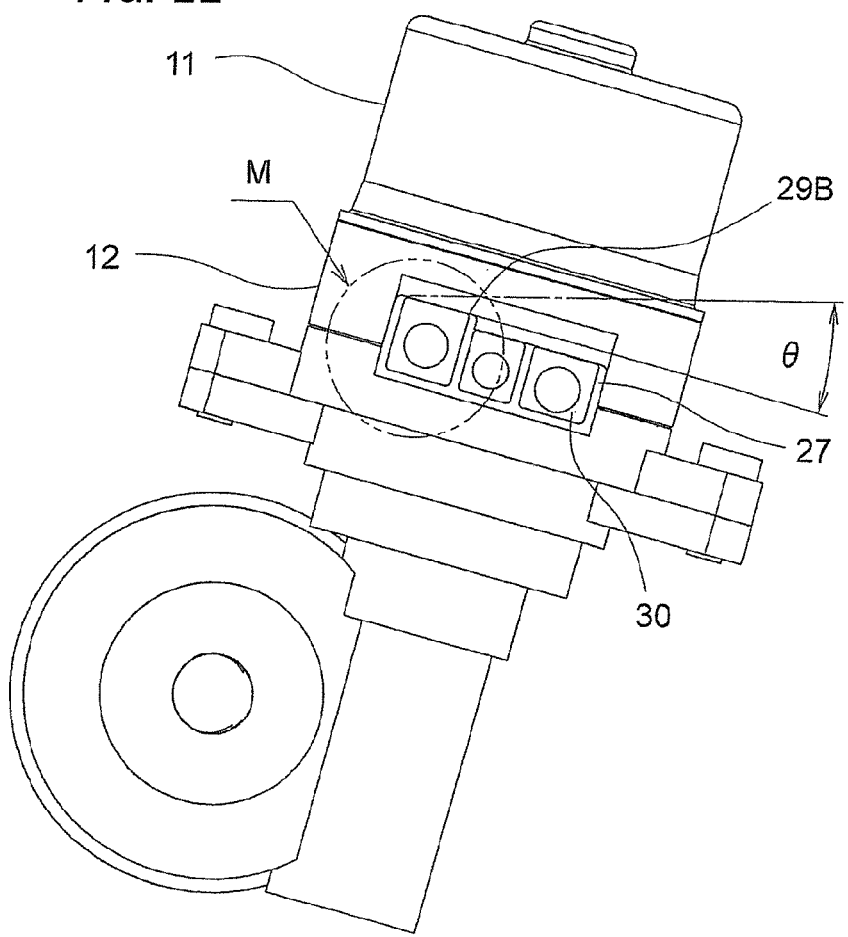
FIG. 22 is a side view illustrating an electric power steering device according to an eighth embodiment of the present invention.
Figure 23:
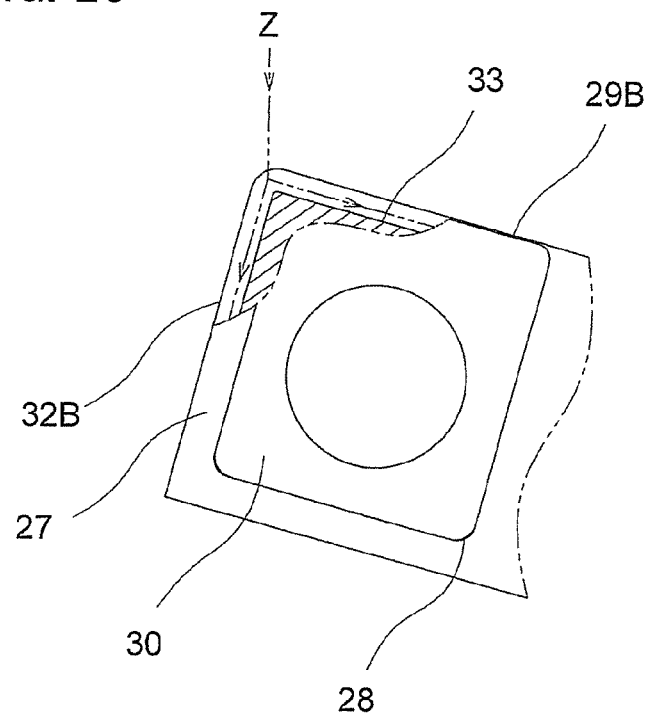
FIG. 23 is an enlarged view illustrating a portion (portion M) indicated by the arrow M in FIG. 22.

FIG. 22 is a side view illustrating an electric power steering device according to an eighth embodiment of the present invention, and FIG. 23 is an enlarged view illustrating a portion (portion M) indicated by the arrow M in FIG. 22.

In this embodiment, the upper surface 29B of the female connector 27 is inclined at the angle θ toward one side in the width direction when the female connector 27 is viewed from the front side along the upper surface 29B. On the upper surface 29B and both the side surfaces 32B of the female connector 27, a plurality of the waterways 33 are formed.

The remaining configuration is the same as that of the electric power steering device of the seventh embodiment.

According to the electric power steering device of this embodiment, water falls along the waterways 33 formed on the upper surface 29B and the side surface 32B as indicated by the arrow Z. Therefore, the same effects as those of the electric power steering device according to the first embodiment can be obtained.

Ninth Embodiment

Figure 24:
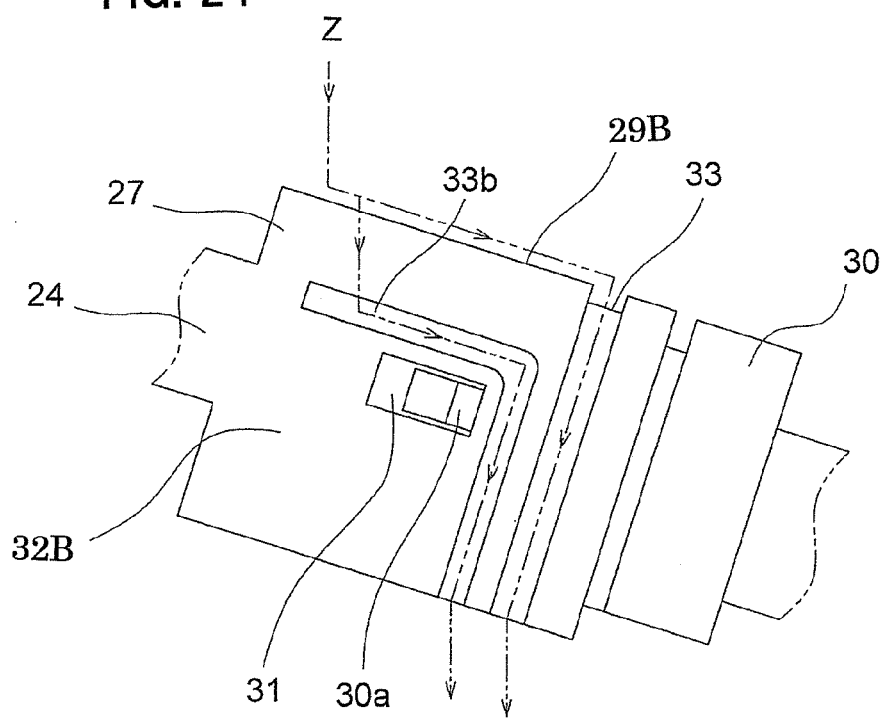
FIG. 24 is a side view illustrating a principal part of an electric power steering device according to a ninth embodiment of the present invention.

FIG. 24 is a side view illustrating a principal part of an electric power steering device according to a ninth embodiment of the present invention.

In this embodiment, the locking holes 31 are formed in the side surface 32B of the female connector 27. On the side surface 32B, the locking-hole waterway 33b having one side located above the locking hole 31 so as to extend in parallel to the upper surface 29B and another side extending in parallel to the waterway 33 is formed.

The remaining configuration is the same as that of the electric power steering device of the seventh embodiment.

According to the electric power steering device of this embodiment, water falls along the waterways 33 and the locking-hole waterway 33b as indicated by the arrow Z. Therefore, the same effects as those of the electric power steering device according to the first embodiment can be obtained.

Tenth Embodiment

Figure 25:
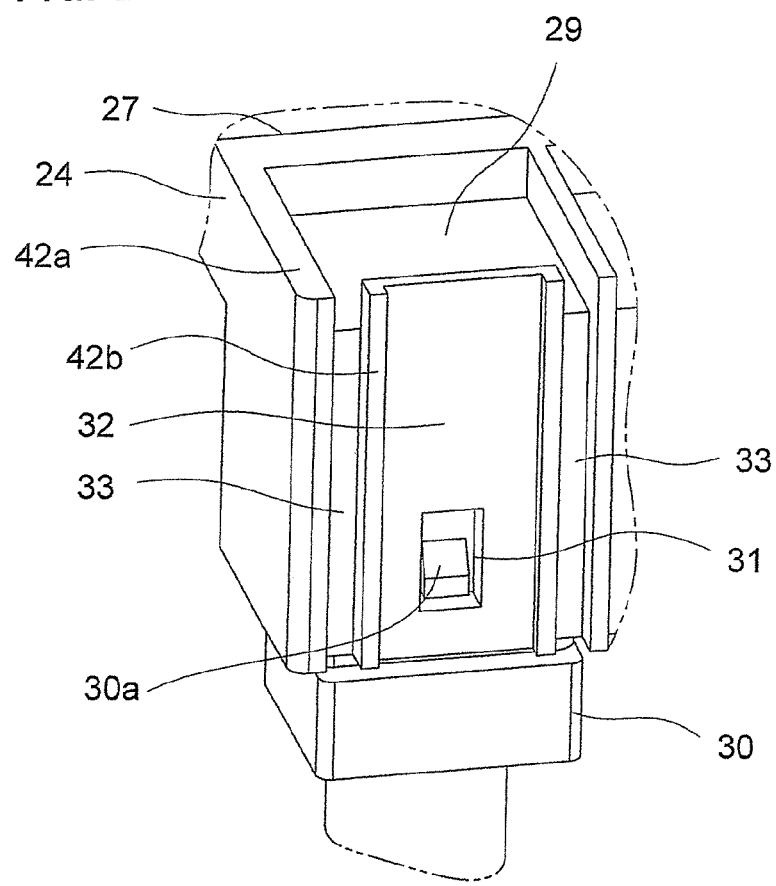
FIG. 25 is a perspective view illustrating a principal part of an electric power steering device according to a tenth embodiment of the present invention.

FIG. 25 is a perspective view illustrating a principal part of an electric power steering device according to a tenth embodiment of the present invention.

In this embodiment, a first rib 42a extending on edge portions of the upper surface 29 and the side surface 32 is formed. On an inner side of the first rib 42a, second ribs 42b surrounding the locking hole 31 are formed. The waterways 33 are formed by the second ribs 42b and the first rib 42a.

Water on the inclined upper surface 29 directly flows down and is subsequently split into the left and right waterways 33 to flow down on the side surface 32.

The remaining configuration is the same as that of the electric power steering device of the first embodiment.

According to the electric power steering device of this embodiment, the waterways 33 can be formed by the first rib 42a and the second ribs 42b without cutting surfaces of the upper surface 29 and the side surface 32 of the female connector 27. Therefore, the same effects as those of the electric power steering device of the first embodiment can be obtained.

Eleventh Embodiment

Figure 26:
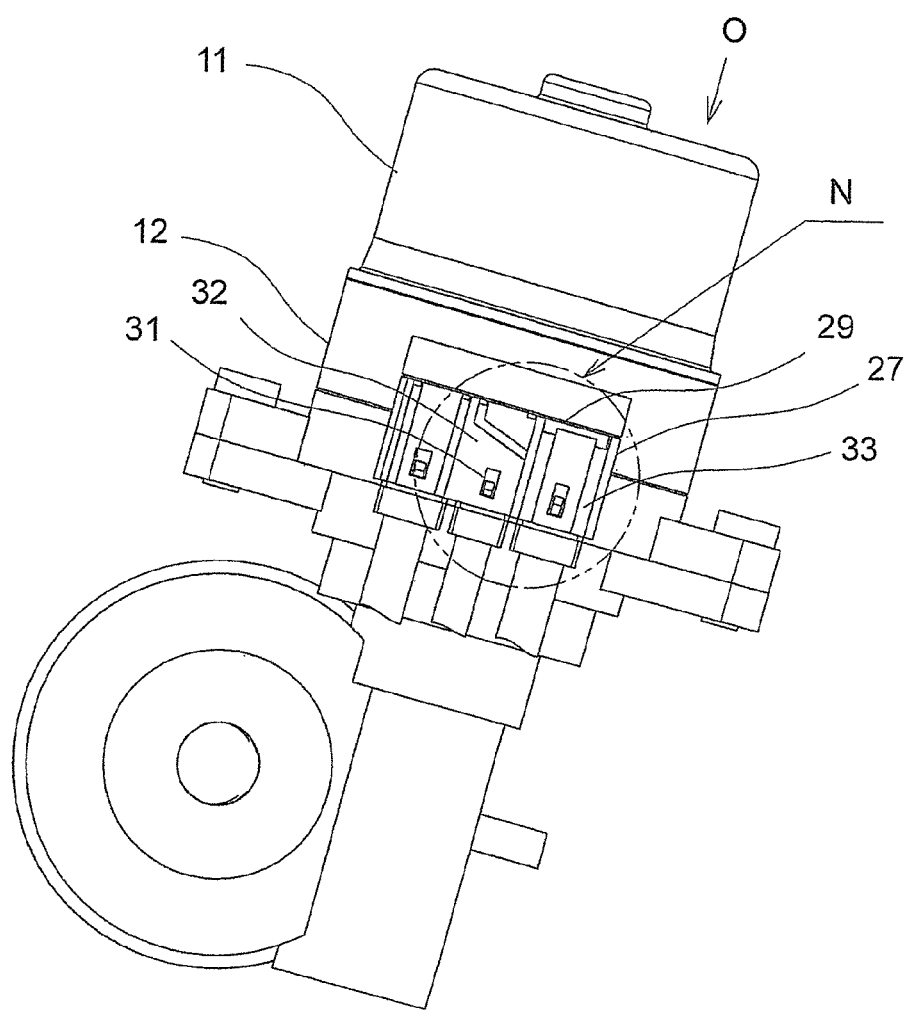
FIG. 26 is a side view illustrating an electric power steering device according to an eleventh embodiment of the present invention.
Figure 27:
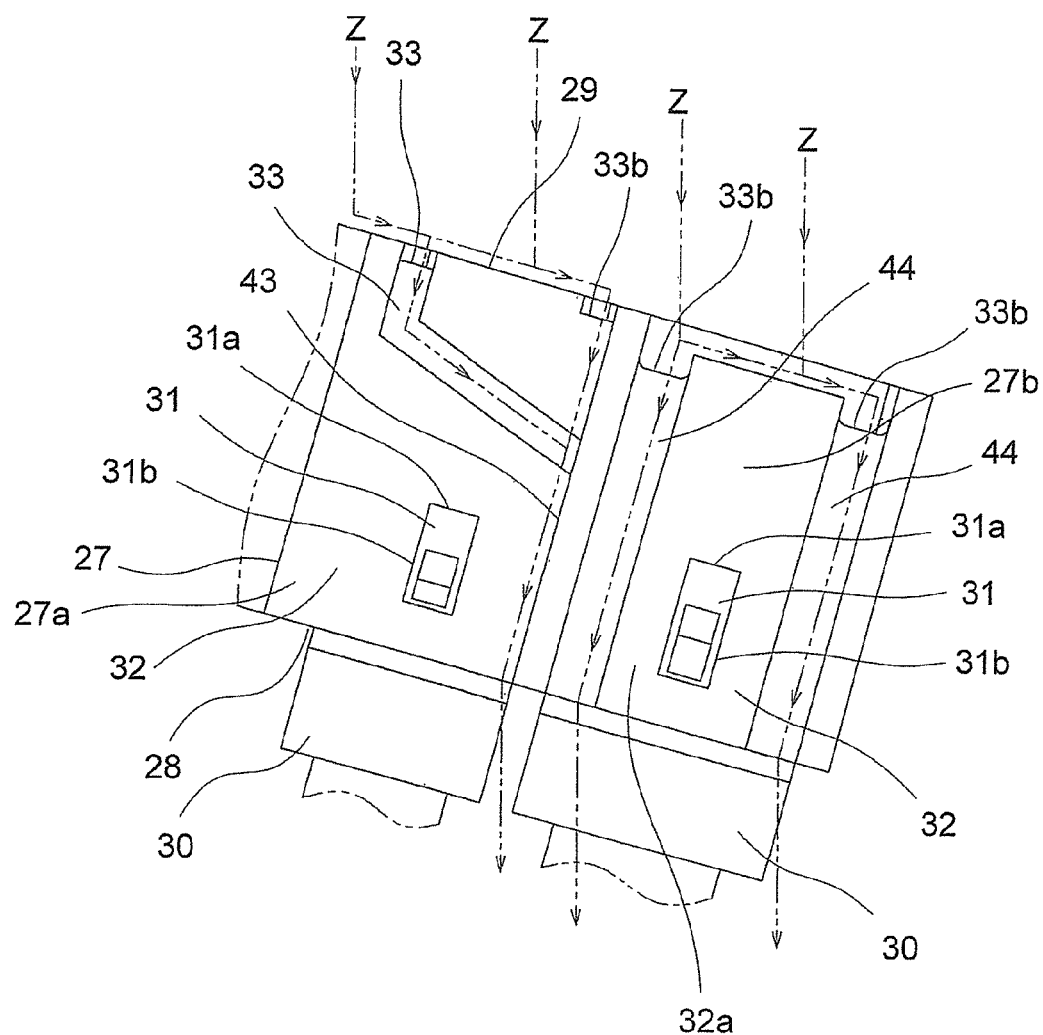
FIG. 27 is an enlarged view of a portion (portion N) indicated by the arrow N in FIG. 26.
Figure 28:
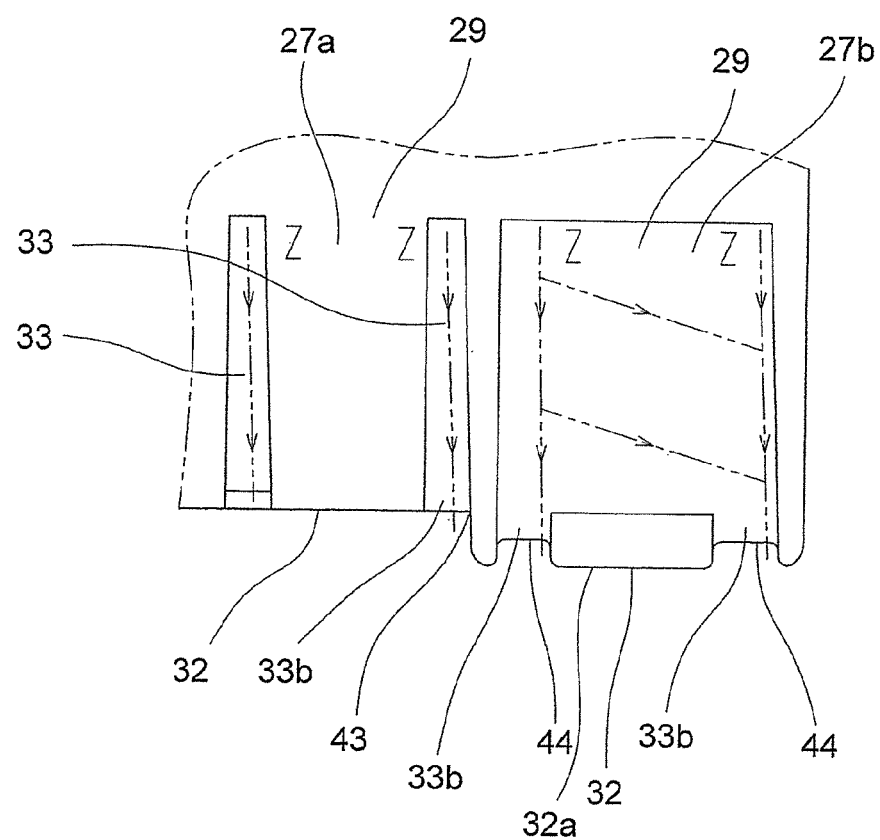
FIG. 28 is a partial enlarged view as viewed from a direction of the arrow 0 in FIG. 26.

FIG. 26 is a side view illustrating an electric power steering device according to an eleventh embodiment of the present invention, FIG. 27 is an enlarged view of a portion (portion N) indicated by the arrow N in FIG. 26, and FIG. 28 is a partial enlarged view as viewed from a direction of the arrow O in FIG. 26.

In this embodiment, as in the case of the second embodiment, the upper surface 29 of the female connector 27 is inclined at the angle θ to one side in the width direction when the female connector 27 is viewed from the front side along the upper surface 29.

The female connector 27 includes a level difference portion 43 at which a second connector portion 27b projects radially as compared with a first connector portion 27a, which is formed between the first connector portion 27a and the second connector portion 27b adjacent to each other on the side surface 32. Further, on an intermediate portion of the second connector portion 27b, the convex surface 32a extending in the vertical direction with a large width is formed.

In this embodiment, the level difference portion 43 serves as a wall surface of the waterway 33 on the first connector portion 27a, whereas the concave portions 44 on both side of the convex surface 32a also serve as the waterways 33 on the second connector portion 27b.

According to the electric power steering device of this embodiment, water falls along the waterways 33 as indicated by the arrow Z. Therefore, the same effects as those of the electric power steering device according to the first embodiment can be obtained.

Twelfth Embodiment

Figure 29:
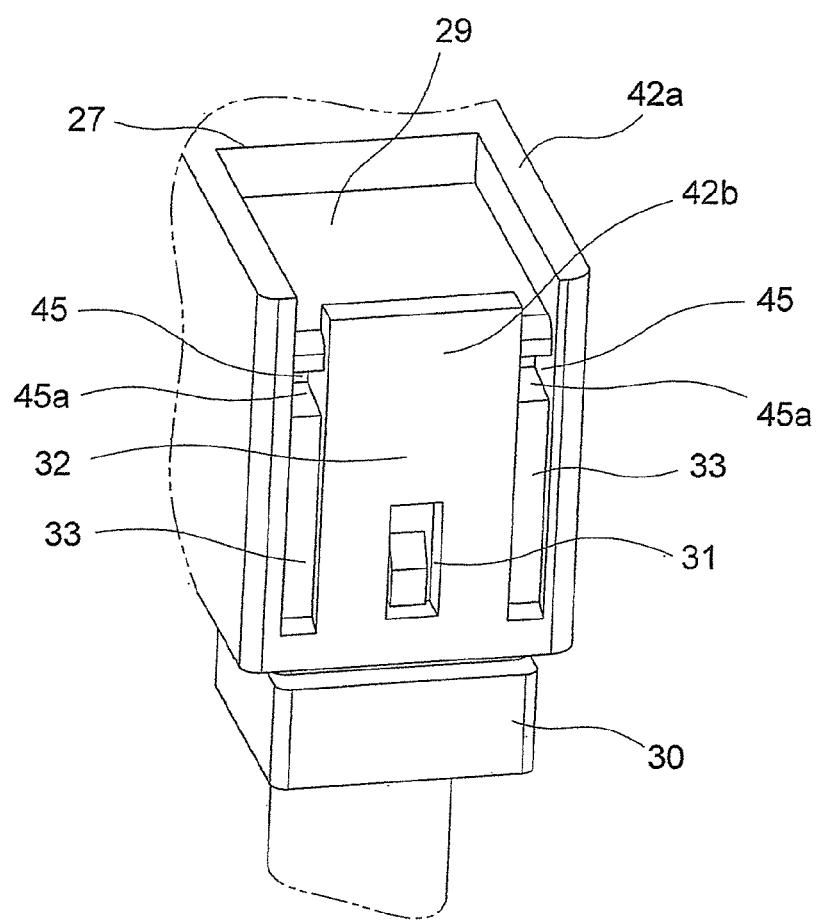
FIG. 29 is a perspective view illustrating a principal part of an electric power steering device according to a twelfth embodiment of the present invention.

FIG. 29 is a perspective view illustrating a principal part of an electric power steering device according to a twelfth embodiment of the present invention.

In this embodiment, the first rib 42a is formed over the edge portions of the upper surface 29 and the side surface 32. On the inner side of the first rib 42a, the second rib 42b surrounding the locking hole 31 is formed. The waterways 33 are formed by the second rib 42b and the first rib 42a.

Thinned portions 45 for preventing resin sink at the time of molding of the female connector 27 are formed on the waterways 33 formed on the side surface 32. A surface 45a inclined downward in the radial direction is formed on each of the thinned portions 45.

Water on the inclined upper surface 29 directly flows down and is subsequently split into the left and right waterways 33 to flow down on the side surface 32.

The remaining configuration is the same as that of the electric power steering device of the first embodiment.

In this embodiment, the thinned portions 45 are used as a part of the waterways 33. In addition, even if water flows on the thinned portions 45, each of the surfaces 45a thereof has a slope descending in the downstream direction. Therefore, the water does not accumulate on the thinned portions 45.

Thirteenth Embodiment

Figure 30:
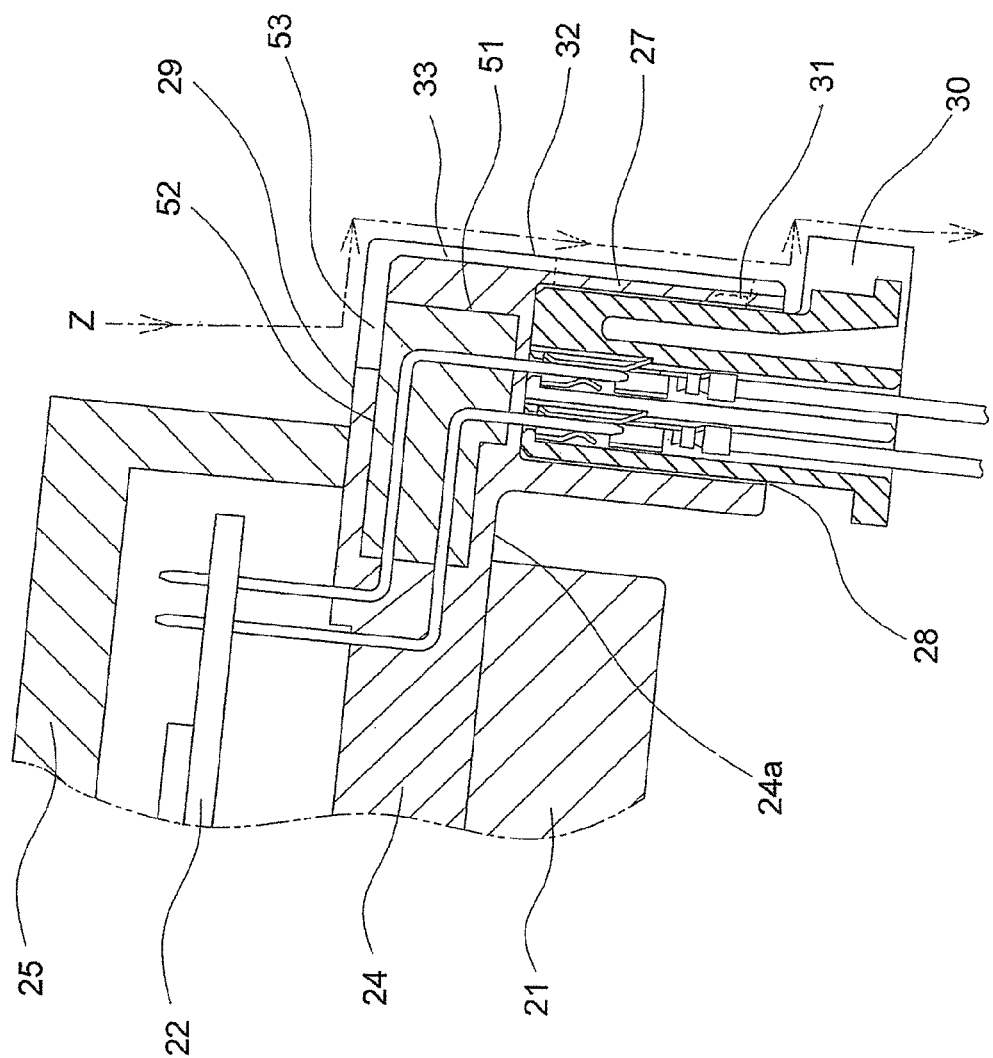
FIG. 30 is an enlarged sectional view illustrating a principal part of an electric power steering device according to a thirteenth embodiment of the present invention.

FIG. 30 is an enlarged sectional view illustrating a principal part of an electric power steering device according to a thirteenth embodiment of the present invention.

In this embodiment, a connection terminal unit 51, which is a connecting portion of the female connector 27 for the torque sensor 4, the vehicle-speed sensor 5, and the power supply unit 14, is formed by pre-molding of terminals made of a metal with a resin.

At the time of insert molding of the female connector 27, a mold clamping hole 53 having a die interposition/fixing surface 52 as a bottom surface for interposing and fixing the connection terminal unit 51 between dies is formed.

In this embodiment, the mold clamping hole 53 is formed in the upper surface 29 and the side surface 32 of the female connector 27 and is used as a part of the waterway 33.

Fourteenth Embodiment

Figure 31:
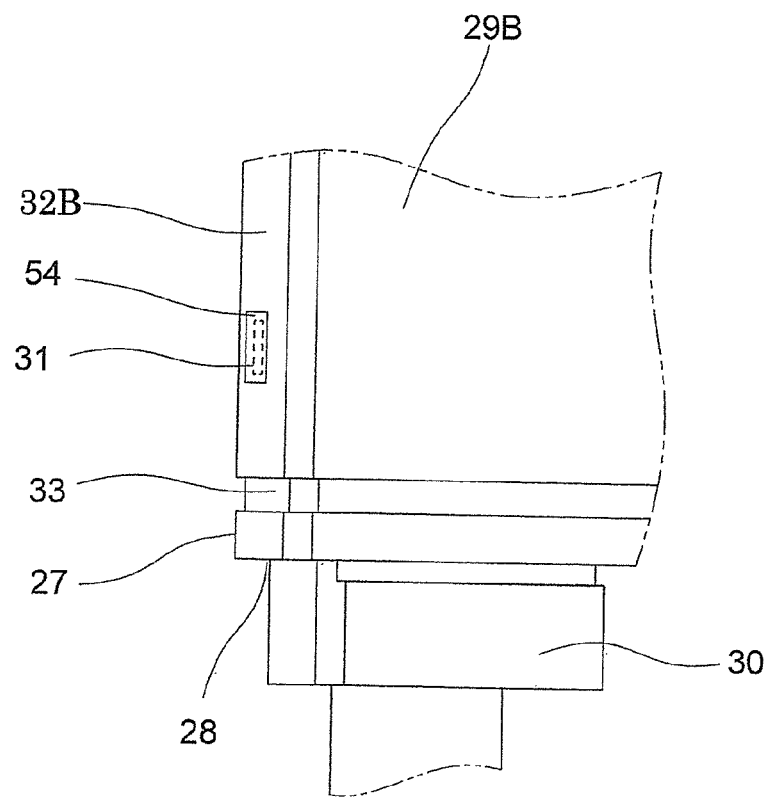
FIG. 31 is an enlarged plan view illustrating a principal part of an electric power steering device according to a fourteenth embodiment of the present invention.
Figure 32:
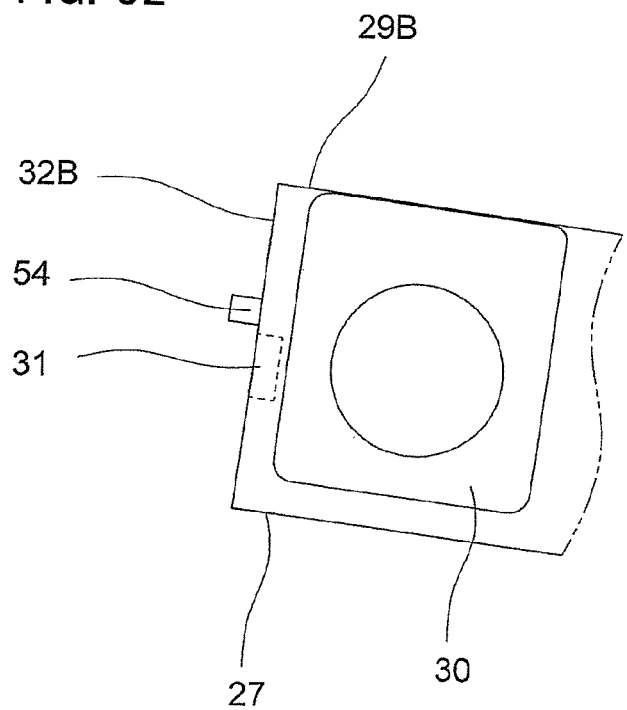
FIG. 32 is a front view of FIG. 31.

FIG. 31 is an enlarged plan view illustrating a principal part of an electric power steering device according to a fourteenth embodiment of the present invention, and FIG. 32 is a front view of FIG. 31.

In this embodiment, the upper surface 29B of the female connector 27 is inclined to one side in the width direction when the female connector 27 is viewed from the front side along the upper surface 29B.

In the female connector 27, the locking hole 31 that is the opening hole is formed on the side surface 32B on which water flows down. Above the locking hole 31, a roof 54 is arranged.

The area of the roof 54 has such a size that at least the locking hole 31 is covered as viewed along a direction in which water flows down.

In this embodiment, the roof 54 is arranged above the locking hole 31. Therefore, the water flowing down on the side surface 32B can be prevented from entering inside of the control unit 12 through the locking hole 31.

Although, in each of the embodiments described above, the female connector 27 has been described as the block body obtained by integrally configuring a torque-sensor connector unit that is the signal connector unit of the torque sensor 4, a vehicle-sensor connector unit that is the signal connector unit of the vehicle-speed sensor 5, and the power-supply unit connector unit of the power supply unit 14, the female connector is not limited thereto.

As illustrated in FIG. 33, the first connector unit 27a that is the torque-sensor connector unit, the second connector unit 27b that is the vehicle-speed sensor connector unit, and a third connector unit 27c that is the power-supply unit connector unit may be separate members, and female connector units (not shown) may be respectively fitted to the connector units 27a, 27b, and 27c. Further, only one of the connector units may be configured as a separate member.

Even by using the female connector portions described above, the same effects as those of the electric power steering device of the first embodiment can be obtained.

Further, in each of the embodiments described above, when the female connector 27 is viewed from the front side along the upper surface 29, 29A, or 29B, water is made to flow down with the upper surface 29, 29A, or 29B of the female connector 27, which is oriented upward, being inclined to the near side or one side in the width direction. However, the direction of water flow is not limited to those described above. In short, the waterways 33 only need to be formed on the surface of the female connector 27 so as to prevent the water flowing down on the upper surface from entering the fitting opening 28 and the locking holes 31.

Further, although a sectional shape of each of the waterways 33 is a sideways U-like shape in each of the embodiments described above, the shape thereof is not limited thereto. For example, a U-like shape, a V-like shape, an L-like shape, or a combination of the above-mentioned shapes may be used.

Further, although the control unit 12 including the female connector 27 has been described in each of the embodiments described above, the connector is not limited thereto. The male connector may be used instead.

The fitting opening of the female connector 27 and the locking hole 31 of the female connector 27 have been described as the opening hole. Besides, the opening hole may also be a locking hole for, for example, locking to a locking portion of a component other than the connector, which is adjacent to the connector.

Further, although the electric power steering device built as a vehicle-mounted electronic control device into an automobile has been described in each of the embodiments described above, the present invention is also applicable to an electric power steering device built into an agricultural device such as a tractor or a welfare device built into a wheelchair or the like.

Further, the present invention is also applicable to, for example, a control unit of an infrared receiving device for a vehicle, which is the vehicle-mounted electronic control device and built into a key-less entry system.

REFERENCE SIGNS LIST 1 steering wheel, 2 steering shaft, 3 steering column, 4 torque sensor, 5 vehicle-speed sensor, 11 electric motor, 12 control unit, 13 speed-reduction gearbox, 14 power supply unit, 21 heat sink, 22 control board, 23 power unit, 24 frame, 24a reference plane of frame, 24b center portion of frame, 25 housing, 27 female connector, 27a first connector portion, 27b second connector portion, 27c third connector unit, 28 fitting opening (opening hole), 29, 29A, 29B upper surface, 30 male connector, 31 locking hole (opening hole), 32, 32A, 32B side surface, 33 waterway, 33a waterway wall of waterway on downstream side, 33b locking-hole waterway, 36 microcomputer, 42a first rib, 42b second rib, 45 thinned portion, 46 first rib, 47 second rib, 46a, 47a end surface, 51 connection terminal unit, 52 die interposition/fixing surface, 53 mold clamping hole, 54 roof

The invention claimed is:

1. A vehicle-mounted electronic control device, comprising a control unit comprising:
   a control board having a control circuit mounted thereon;
   a housing for covering the control board; and
   a connector body projecting from the housing and exposed externally relative to the housing, the connector body housing at least one connector for electrically connecting the control board and an external wiring to each other,
   the connector body having an opening hole formed in at least one of a side surface and a lower surface relative to an upper surface that is an upward oriented surface, and a waterway formed on a surface of the connector body, for preventing flowing down water from entering the opening hole,
   wherein:
   the connector body comprises, on the side surface:
      a first connector unit; and
      a second connector unit adjacent to the first connector unit, the second connector unit comprising a step portion projecting in a vertical direction from the first connector unit relative to the side surface, and concave portions formed on both sides of the side surface;
   the step portion of the second connector unit forms the waterway of the first connector unit; and
   the concave portions of the second connector unit form the waterway on the second connector unit.

2. A vehicle-mounted electronic control device according to claim 1, wherein:
   the waterway comprises waterways; and
   the waterways join together on the upper surface or the side surface at a middle of the waterways.

3. A vehicle-mounted electronic control device according to claim 1, wherein the waterway is split on the upper surface or the side surface at a middle of the waterway.

4. A vehicle-mounted electronic control device according to claim 1, wherein the waterway has a width enlarging toward downstream.

5. A vehicle-mounted electronic control device according to claim 1, wherein the waterway comprises a groove formed by cutting out the surface or ribs each projecting from the surface.

6. A vehicle-mounted electronic control device according to claim 1, wherein:
   each of the concave portions comprises a thinned portion for preventing resin sink at time of molding of the second connector unit; and
   the thinned portion comprises an inclined surface inclined downward in a downstream direction.

7. A vehicle-mounted electronic control device according to claim 5, wherein:
   the ribs are formed in pairs so as to be opposed to the upper surface each other and interpose the opening hole therebetween as viewed from the upper surface in the vertical direction; and
   one of the ribs, which is formed on an upstream side of the water, extends over a long length in the vertical direction relative to the side surface as compared with another of the ribs, which is formed on the downstream side.

8. A vehicle-mounted electronic control device according to claim 1, wherein:
   the connector body comprises a connection terminal unit formed by pre-molding, which is to be electrically connected to the external wiring;
   the vehicle-mounted electronic control device has a mold clamping hole having a die interposition/fixing surface for interposing and fixing the connection terminal unit between dies as a bottom surface; and
   the mold clamping hole forms a part of the waterway.

9. A vehicle-mounted electronic control device according to claim 1, further comprising a projecting roof portion for inhibiting the water from entering the opening hole, the projecting roof portion being arranged on an upstream side of the water flowing down toward the opening hole.

10. A vehicle-mounted electronic control device according to claim 1, wherein the connector body comprises, as an integral block body, a power-supply connector unit and a signal connector unit, which are to be electrically connected to the external wiring.

11. A vehicle-mounted electronic control device according to claim 1, wherein the upper surface is inclined downward toward a near side when the connector body is viewed from a front side along the upper surface.

12. A vehicle-mounted electronic control device according to claim 1, wherein the upper surface is inclined toward one side in a width direction when the connector body is viewed from a front side along the upper surface.

13. A vehicle-mounted electronic control device according to claim 1, wherein the opening hole comprises a fitting opening of the connector body.

14. A vehicle-mounted electronic control device according to claim 1, wherein the opening hole comprises a locking hole formed in the connector body, and a locking portion of a matching connector is elastically locked to the locking hole.

* * * * *